United States Patent
Shue et al.

(10) Patent No.: US 8,410,607 B2
(45) Date of Patent: Apr. 2, 2013

(54) SEMICONDUCTOR MEMORY STRUCTURES

(75) Inventors: Shau-Lin Shue, Hsinchu (TW); Chao-An Jong, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1006 days.

(21) Appl. No.: 11/763,938

(22) Filed: Jun. 15, 2007

(65) Prior Publication Data
US 2008/0308782 A1    Dec. 18, 2008

(51) Int. Cl.
*H01L 23/48* (2006.01)
*H01L 23/52* (2006.01)
*H01L 29/40* (2006.01)

(52) U.S. Cl. .................. 257/758; 257/E27.004

(58) Field of Classification Search ............. 257/758, 257/774, E27.004
See application file for complete search history.

(56) References Cited

U.S. PATENT DOCUMENTS

| | | | |
|---|---|---|---|
| 6,566,700 B2 | 5/2003 | Xu | |
| 6,586,761 B2 * | 7/2003 | Lowrey | 257/3 |
| 6,605,821 B1 | 8/2003 | Lee et al. | |
| 6,867,425 B2 | 3/2005 | Wicker | |
| 6,894,305 B2 | 5/2005 | Yi et al. | |
| 6,908,812 B2 * | 6/2005 | Lowrey | 438/253 |
| 7,161,167 B2 * | 1/2007 | Johnson | 257/5 |
| 7,397,029 B2 * | 7/2008 | Berkout et al. | 250/288 |
| 8,129,709 B2 * | 3/2012 | Seko et al. | 257/5 |
| 2001/0034078 A1 * | 10/2001 | Zahorik et al. | 438/95 |
| 2002/0187633 A1 | 12/2002 | Akram | |
| 2003/0001242 A1 | 1/2003 | Lowrey et al. | |
| 2003/0027398 A1 * | 2/2003 | Maimon et al. | 438/382 |
| 2003/0047762 A1 * | 3/2003 | Lowrey | 257/276 |
| 2003/0080427 A1 * | 5/2003 | Hudgens et al. | 257/748 |
| 2003/0209746 A1 | 11/2003 | Horii | |
| 2003/0219924 A1 * | 11/2003 | Bez et al. | 438/102 |
| 2004/0113181 A1 * | 6/2004 | Wicker | 257/246 |
| 2005/0002227 A1 | 1/2005 | Hideki et al. | |
| 2005/0029503 A1 * | 2/2005 | Johnson | 257/4 |
| 2005/0035342 A1 * | 2/2005 | Chen | 257/2 |
| 2005/0174861 A1 * | 8/2005 | Kim et al. | 365/200 |
| 2005/0184282 A1 | 8/2005 | Lai et al. | |
| 2005/0191804 A1 | 9/2005 | Lai et al. | |

(Continued)

OTHER PUBLICATIONS

Young Sam Park et al., Phase Change Memory Device with U-shaped Heater (PCM-U), Functional Electronic Device Team, IT Convergence and Components Laboratory, Electronics & Telecommunications Research Institute (ETRI), Daejeon 305-700, Korea, May 2006.

(Continued)

*Primary Examiner* — Steven Loke
*Assistant Examiner* — Igwe U Anya
(74) *Attorney, Agent, or Firm* — Duane Morris LLP

(57) ABSTRACT

A semiconductor structure includes a transistor over a substrate, the transistor comprising a gate and a contact region, which is adjacent to the gate and within the substrate. A first dielectric layer is over the contact region. A contact structure is within the first dielectric layer and over the contact region. A first electrode and a second electrode are within the first dielectric layer, wherein at least one of the first electrode and the second electrode is over the contact structure. The first electrode and second electrodes may be laterally or vertically separated. A phase change structure is disposed between the first electrode and the second electrode. The phase change structure includes at least one spacer within the first dielectric layer and a phase change material (PCM) layer over the spacer.

16 Claims, 36 Drawing Sheets

U.S. PATENT DOCUMENTS

| | | | |
|---|---|---|---|
| 2006/0006374 A1* | 1/2006 | Chang | 257/2 |
| 2006/0148229 A1 | 7/2006 | Wang et al. | |
| 2006/0189045 A1 | 8/2006 | Shum et al. | |
| 2006/0266992 A1* | 11/2006 | Matsui et al. | 257/4 |
| 2007/0012905 A1 | 1/2007 | Huang | |
| 2007/0099377 A1 | 5/2007 | Happ et al. | |
| 2007/0120105 A1* | 5/2007 | Chao et al. | 257/3 |
| 2007/0120107 A1* | 5/2007 | Hayakawa | 257/4 |
| 2007/0173010 A1* | 7/2007 | Lee et al. | 438/235 |
| 2007/0187664 A1* | 8/2007 | Happ | 257/4 |
| 2008/0044632 A1* | 2/2008 | Liu et al. | 428/192 |
| 2008/0054244 A1* | 3/2008 | Lee et al. | 257/3 |
| 2008/0061341 A1 | 3/2008 | Lung | |
| 2008/0142777 A1* | 6/2008 | Park et al. | 257/4 |
| 2008/0303013 A1* | 12/2008 | Happ et al. | 257/3 |
| 2009/0127537 A1* | 5/2009 | Jedema et al. | 257/4 |

OTHER PUBLICATIONS

S. Lai et al, "OUM—A 180 nm Nonvolatile Memory Cell Element Technology for Stand Alone and Embedded Applications", IEDM Tech. Dig., 2001.

F. Pellizzer et al., "Novel uTrench Phase-Change Memory Cell for Embedded and Stand-Alone Non-Volatile Memory Applications", 2004 Symposium on VLSI Technology.

J. H. Oh et al., "Full Integration of Highly Manufacturable 512Mb PRAM based on 90 nm Technology", IEDM Tech. Dig., 2006.

Y. C. Chen et al., "Ultra-Thin Phase-Change Bridge Memory Device Using GeSb", IBM/Qimonda/Macronix PCRAM Joint Project, 2006 IEEE.

Martijn H. R. Lankhorst et al., "Low-cost and nanoscale non-volatile memory concept for future silicon chips", Philips Research Laboratories, Prof. Holstlaan 4, 5656 AA Eindhoven, The Netherlands, 2005 Nature Publishing Group.

Y. N. Hwang et al., "Writing Current Reduction for High-density Phase-change RAM", Korea, 2003 IEEE.

R. Neale, "Amorphous non-volatile memory: the past and the future", Electronic Engineering, London, Apr. 2001.

Y. N. Hwang et al., "Full Integration and Reliability Evaluation of Phase-change RAM Based on 0.24 um-CMOS Technologies", Korea, 2003 Symposium on VLSI Technology Digest of Technical Papers.

* cited by examiner

SEMICONDUCTOR MEMORY STRUCTURES

BACKGROUND OF THE INVENTION

1. Field of the Invention

The present invention relates, most generally, to semiconductor structures, and more particularly to phase change memory (PCM) cells.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been introduced and are being used along with techniques for overcoming manufacturing obstacles associated with these materials and requirements.

Generally, memory includes volatile memory and nonvolatile memory. Volatile memory such as dynamic random access memory (DRAM) is provided to store data or information of a system. A DRAM cell may include a transistor and a capacitor. Due to its simple structure, costs for manufacturing DRAM devices are low and the process for manufacturing DRAMs is easier than that for non-volatile memories. However, when voltages applied to DRAM are turned off, data stored in the DRAM cell will disappear. Also, DRAM cells must be periodically refreshed to maintain the data stored therein, because of current leakages from DRAM capacitors.

Nonvolatile memory such as Flash memory has been widely used to maintain data even if input voltages applied to the Flash memory are removed. Data stored in Flash memory cells can be desirably removed by UV radiation or electrical erasing. However, a Flash memory cell usually includes multiple gate structures for storing data and is more complex than a DRAM cell. Further, the erase/re-write cycle of Flash memory is another issue due to leakage currents from floating gates of the Flash memory cell. Accordingly, processes for manufacturing Flash memory are more difficult than those for DRAM devices, and costs for manufacturing high quality Flash memory structures with more erase/re-write cycles are comparatively high.

Recently, various nonvolatile memory devices such as phase-change memory (PCM), magnetic random access memory (MRAM) or ferroelectric random access memory (FRAM) devices having cell structures that are similar to those of DRAM devices, have been proposed.

FIG. 1 is a schematic equivalent circuit of a PCM cell.

Referring to FIG. 1, a PCM cell 100 includes a transistor 110 and a phase change element 120. A source/drain (S/D) of the transistor 110 is coupled to ground, and another S/D of the transistor 110 is coupled to one end of the phase change element 120. The gate of the transistor 110 is coupled to a gate voltage $V_G$. Another end of the phase change element 120 is coupled to a bit line voltage $V_{BL}$.

When the data stored within the phase change element 120 is to be accessed, the voltage $V_G$ is applied to and turns on the transistor 110, and the bit line voltage $V_{BL}$ is applied to the phase change element 120, such that a read current may flow through the phase change element 120 and the transistor 110. Based on the level of the output current, the data stored within the phase change element 120 is accessed.

By changing the phase of a phase change material (not shown) within the phase change element 120, the impedance of the phase change element 120 may dramatically change. For example, the phase change element 120 may have a low impedance and a read current (not shown) flowing through the phase change element 120 and the transistor 110 may be high. The low-impedance phase change element 120 may store a data value of "1." However, if the phase change element 120 has a high impedance, a read current (not shown) flowing through the phase change element 120 and the transistor 110 is low, and the high-impedance phase change element 120 may store a data value of "0."

Since the PCM cell 100 includes one transistor 110 and one phase change element 120, the PCM cell 100 is simple in comparison to that of Flash memory. In addition, PCM transistor 100 uses phase changes of the phase change material (not shown) to define the stored data "0" and "1." The concern for current leakage of the phase change element 120 may be substantially reduced.

Based on the foregoing, PCM structures and methods for incorporating the same into semiconductor devices are desired.

SUMMARY OF THE INVENTION

In accordance with some exemplary embodiments, a semiconductor structure includes a transistor over a substrate, the transistor comprising a gate and a contact region adjacent to the gate and within the substrate. A first dielectric layer is over the contact region. A contact structure is within the first dielectric layer and over the contact region. A first electrode and a second electrode are within the first dielectric layer, wherein at least one of the first electrode and the second electrode is over the contact structure and the first electrode is laterally separated from the second electrode. A phase change structure is disposed between the first electrode and the second electrode. The phase change structure includes at least one spacer within the first dielectric layer and a phase change material (PCM) layer over the spacer.

In accordance with another exemplary embodiment, a semiconductor structure includes a transistor over a substrate, the transistor comprising a gate and a contact region adjacent to the gate and within the substrate. A first dielectric layer is disposed over the contact region. A contact structure is within the first dielectric layer and over the contact region. A first electrode is within the first dielectric layer and a second dielectric layer is over the first electrode. A phase change structure is within the second dielectric layer, the phase change structure comprising at least one conductive spacer within the second dielectric layer and a phase change material (PCM) layer over the conductive spacer. A second electrode is disposed over the phase change structure.

In accordance with another exemplary embodiment, a semiconductor structure includes a transistor over a substrate. The transistor includes a gate and a contact region adjacent to the gate and within the substrate. A first dielectric layer is disposed over the contact region. A contact structure is disposed within the first dielectric layer and over the contact region. A first electrode is disposed within the first dielectric layer. A second dielectric layer lies over the first electrode. A phase change structure is within the second dielectric layer, the phase change structure comprising spacers within the second dielectric layer, a conductive layer extending from a first one of the spacers to the second one of the spacers and a phase change material (PCM) layer over the conductive layer. A second electrode is disposed over the phase change structure.

The above and other features will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIGS. 2A-2L show a sequence of steps of an exemplary method for forming an exemplary phase-change memory (PCM) cell.

DETAILED DESCRIPTION OF EXEMPLARY EMBODIMENTS

Figure 1:
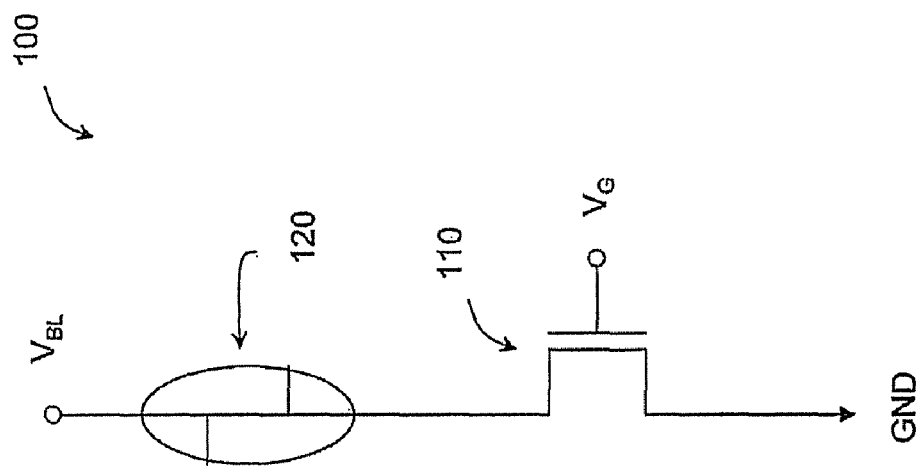
FIG. 1 is a schematic equivalent circuit of a phase-change memory (PCM) cell.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

FIGS. 2A, 2C, 2E, 2G, 2I and 2K are schematic 3-dimensional (3-D) drawings and FIGS. 2B, 2D, 2F, 2H, 2J and 2L are cross-sectional views of the respective 3-D drawings. Together, FIGS. 2A-2L show a sequence of steps of an exemplary method for forming an exemplary phase-change memory (PCM) cell.

Figure 2A:
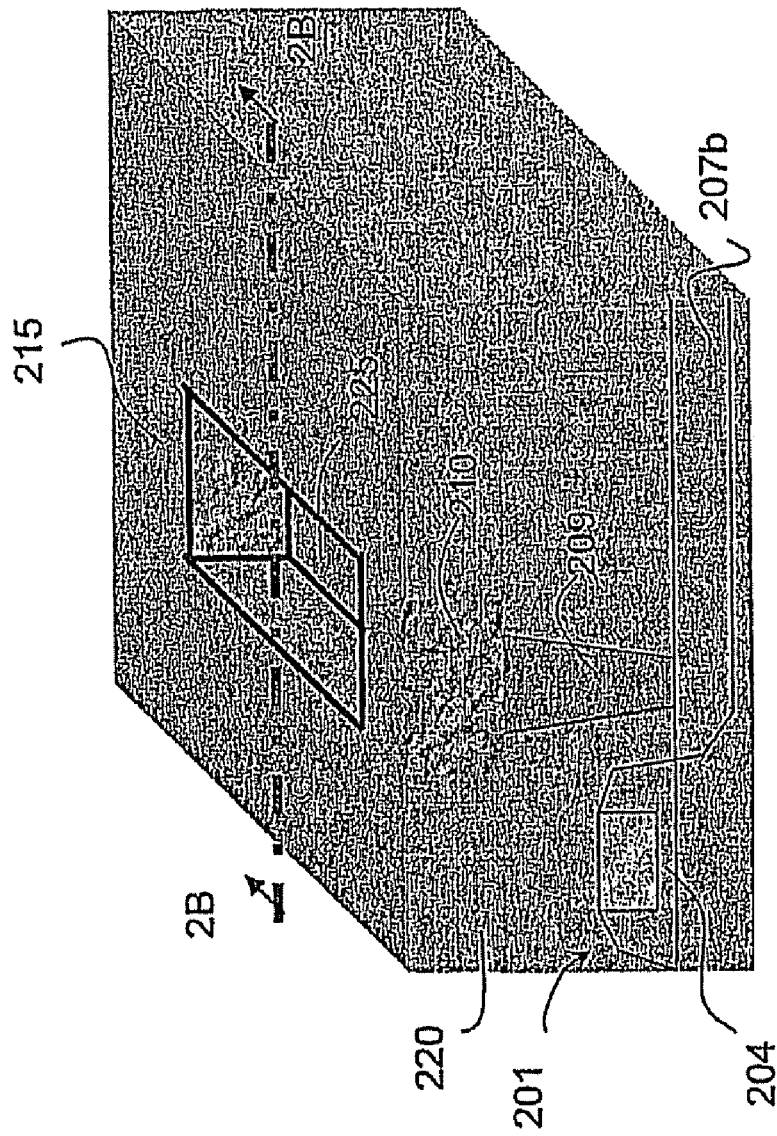
FIGS. 2A, 2C, 2E, 2G, 2I and 2K are schematic 3-dimensional (3-D) drawings

Referring to FIG. 2A, a transistor 201 is formed over a substrate 200. At least one dielectric layer such as dielectric layer 220 is formed over the transistor 201. The transistor 201 includes gate 203 and gate dielectric 204 is between the substrate 200 and the gate 203. At least one conductive structure such as contact plug 209 and/or conductive structures 210, 215 is formed within the dielectric layer 220. The contact plug 209 may electrically coupled to a contact region 207b of the transistor 201. In some embodiments, the conductive layers 210, 215 are electrodes of the PCM cell. The conductive structures 210, 215 may be formed at the same layer. The conductive structures 210, 215 may be laterally separated from each other. In some embodiments, at least one of the conductive structures 210, 215 overlies the contact plug 209. In other embodiments, the conductive structure 210 overlies the contact plug 209 and the conductive structure 215 overlies another contact plug (not shown).

Figure 2B:
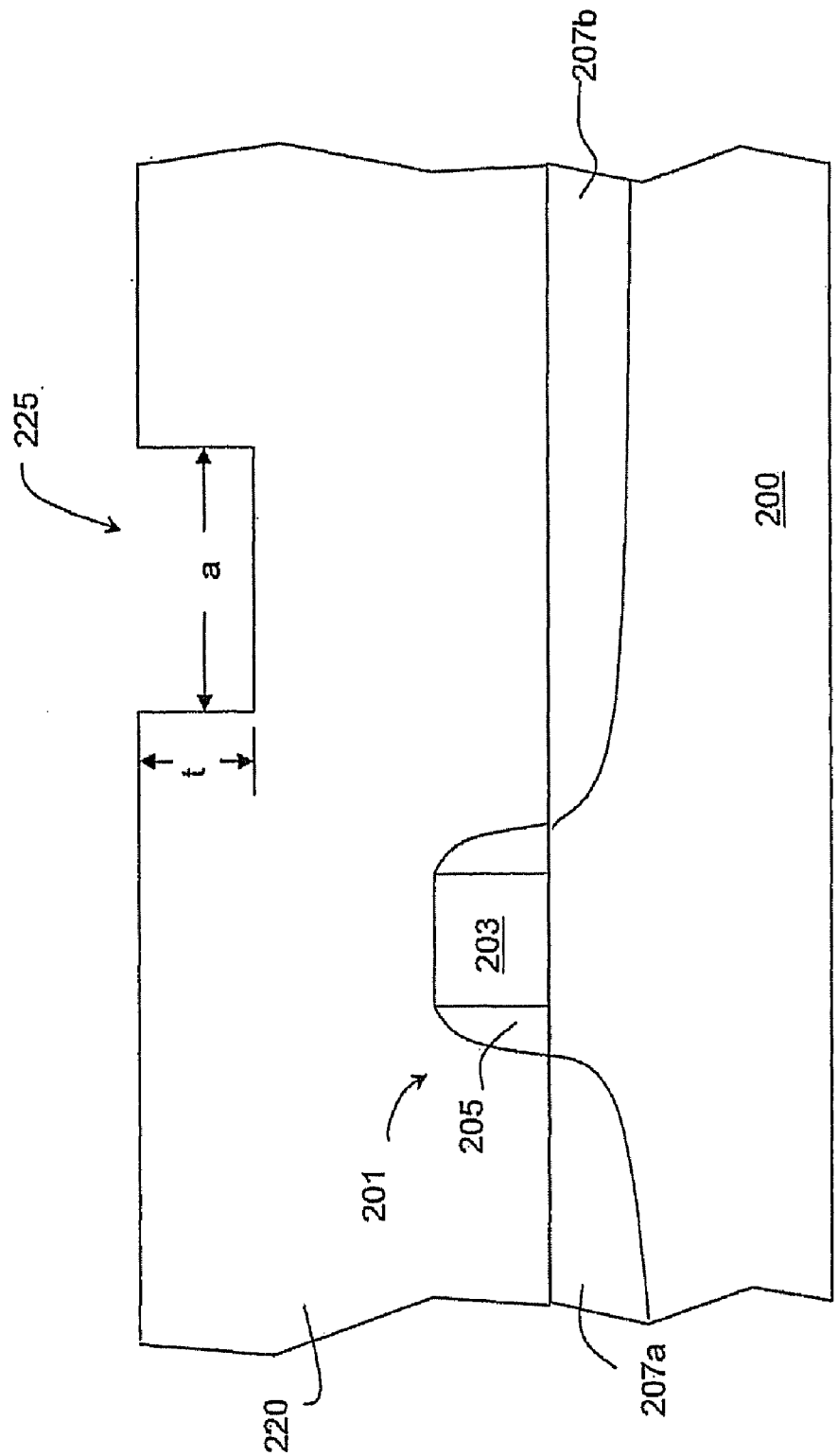
FIGS. 2B, 2D, 2F, 2H, 2J and 2L are cross-sectional views of the respective 3-D drawings. Together.

An opening 225 may be formed between the conductive structures 210, 215. Referring to FIG. 2B, the transistor 201 may comprise, for example, a gate 203 formed over the substrate 200. Spacers 205 are formed on sidewalls of the gate 203. The contact regions 207a, 207b are formed adjacent to the gate 203 or spacers 205 and within the substrate 200.

The substrate 200 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, according to various exemplary embodiments.

In some embodiments, the gate 203 may comprise a dielectric layer (not shown in FIG. 2B but visible in FIG. 2A as gate dielectric 204) thereunder. The dielectric layer (not shown in FIG. 2B) may be generally referred to as a gate dielectric layer. The dielectric layer (not shown in FIG. 2B) may be, for example, a silicon oxide layer, a silicon nitride layer, a silicon oxynitride layer, a high-k dielectric layer containing a material such as $HfO_2$, $HfSiO_4$, $ZrO_2$, $ZrSiO_4$, $Ta_2O_5$, HfSiON or the like, a multiple-layer structure or various combinations thereof. In some embodiments, the dielectric layer may be formed by, for example, a thermal oxidation process, a chemical vapor deposition (CVD) process, an epitaxy process, other suitable processes, or various combinations thereof.

The gate 203 is formed over the substrate 200. The gate 203 may be, for example, a silicon layer, a polysilicon layer, an amorphous silicon layer, a SiGe layer, a conductive material layer, a metallic layer, other suitable layers, or various combinations thereof. In some embodiments, the gate 203 may be formed over gate dielectric 204 and by using a CVD process but other suitable formation processes may alternatively be used in other exemplary embodiments.

The spacers 205 may be at least one dielectric material such as oxide, nitride, oxynitride, or other dielectric material or various combinations thereof. The process for forming the spacers 205 may include, for example, forming a substantially conformal dielectric layer (provided for forming the spacers 205) over the gate 203 and the substrate 200 by a chemical vapor deposition (CVD) process. An etch process such as an etch-back process is applied to remove a portion of the dielectric layer (not shown) so as to form the spacers 205.

In some embodiments, the contact regions 207a, 207b are generally referred to as source/drain (S/D) regions. Gate 203 overlies the channel region which extends from one source/drain region to the other, i.e. left-to-right in FIGS. 2A and 2B. The contact regions 207a, 207b may be formed by, for example, an ion implantation process with dopants at least one of boron, phosphorus, arsenic, or the like or combinations thereof. In some embodiments, the contact regions 207a, 207b may comprise at least one lightly-doped drain (LDD) region (not shown) under the spacer 205 and adjacent to the gate 203.

The conductive layers 210/215 that serve as electrodes of the PCM cell and which are laterally separated from one another as shown in FIG. 2A, are laterally separated along a direction that is substantially orthogonal to the channel direction of transistor 101 formed over substrate 200.

The dielectric layer 220 may be a material such as oxide, nitride, oxynitride, low-k material, ultra-low-k dielectric or other dielectric material or combinations thereof. The dielectric layer 220 may be formed by, for example, a plasma-enchanced CVD (PECVD) process, a spin-on-glass (SOG)

process, an undoped silicate glass (USG) process, other suitable processes for forming such a dielectric layer, or combinations thereof.

Referring again to FIG. 2A, the contact plug 209 may comprise at least one material of tungsten (W), aluminum (Al), copper (Cu), other conductive material or various combinations thereof. The contact plug 209 may be formed by, for example, a CVD process.

Referring again to FIG. 2A, the conductive structures 210, 215 may comprise a material formed of a metallic material (e.g., titanium tungsten (TiW), W, platinum (Pt), platinum iridium (PtIr), copper (Cu), aluminum (Al), AlCu, aluminum silicon copper (AlSiCu) or other metallic material); a metallic nitride (e.g., titanium nitride (TiN), tantalum nitride (TaN), titanium silicon nitride (TiSiN), titanium aluminum nitride (TiAlN), titanium carbon nitride (TiCN), tantalum silicon nitride (TaSiN), tantalum aluminum nitride (TaAlN), tungsten nitride (WN) or other metallic nitride); a metallic silicide (e.g., titanium silicide ($TiSi_x$), nickel silicide ($NSi_x$), cobalt silicide ($CoSi_x$) or other metallic silicide); a conductive oxide (e.g., iridium oxide ($IrO_2$), ruthenium oxide ($RuO_2$), iridium ruthenium oxide ($IrRuO_3$), lithium niobate ($LiNbO_3$) or other conductive oxides) or various composite material layers (e.g., Ti/TiN, Ta/TaN, TiN/W, TaN/Ta/Cu or other composite material layers). The conductive structures 210, 215 may be formed by, for example, a CVD process, a physical vapor deposition (PVD) process, an electroplating process, a electroless plating process or other process that are suitable for forming such a material layer, or combinations thereof.

In some embodiments, the contact plug 209 and/or conductive structures 210, 215 may be formed by a via/contact process, a metal layer process, a damascene process, a dual damascene process or other semiconductor manufacturing process. One of the conductive structures—conductive structure 210 in the embodiment illustrated in FIG. 2A, directly or indirectly, e.g. through a barrier layer, contacts the contact plug 209.

Referring again to FIG. 2B, the opening 225 is formed within the dielectric layer 220. In some embodiments, the opening 225 may have a depth which is substantially equal to the thickness of the conductive structures 210, 215. In some embodiments using 90-nm technology, the opening 225 may have a width "a", in cross-sectional view, of about 150 nanometers (nm) or less. In some embodiments, the opening 225 may have an aspect ratio (t/a) between about 1.5 and about 3.0. The opening 225 may be formed by a photolithographic process forming a patterned photoresist layer (not shown) having an opening (not shown) corresponding to the opening 225. An etch process uses the patterned photoresist layer and removes a portion of a dielectric layer 220 to form opening 225. After the etch process, the patterned photoresist layer may be removed by, for example, a photolithographic removal process.

Figure 2C:
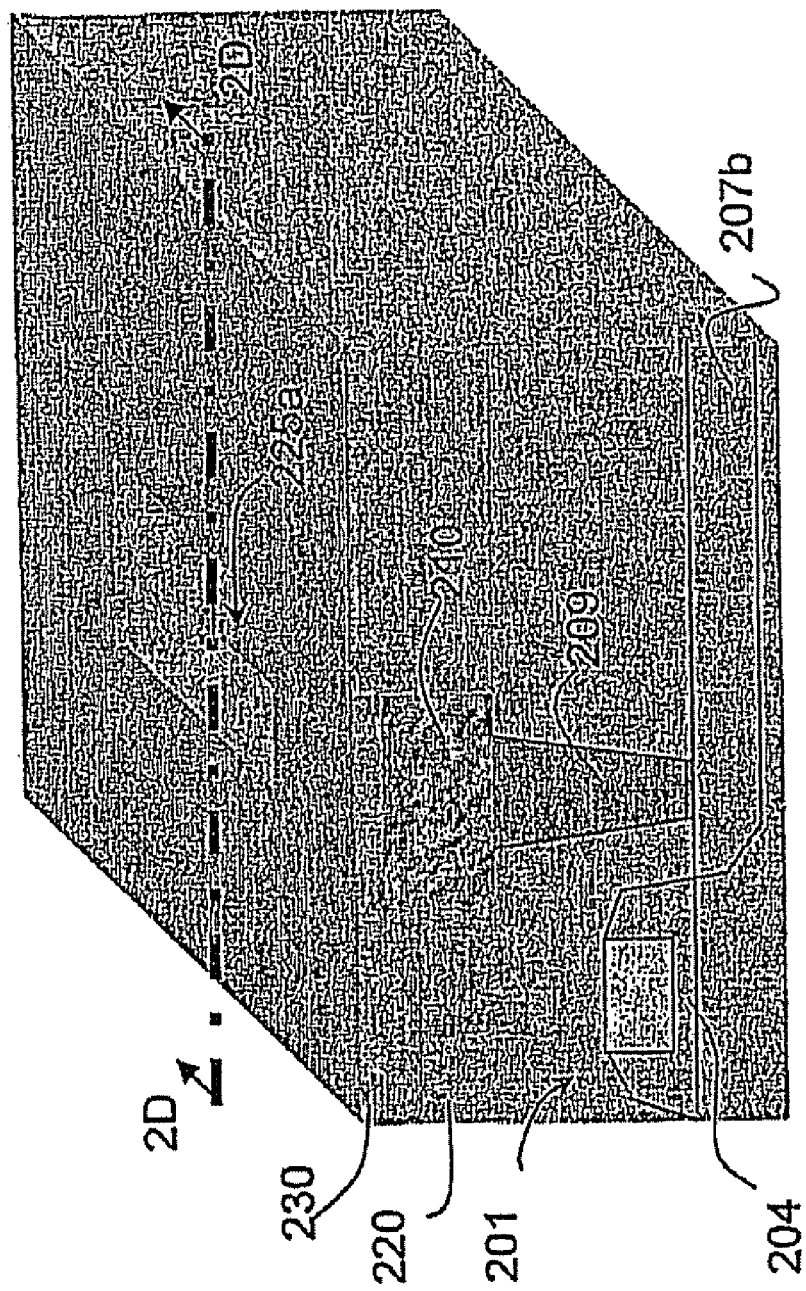
Figure 2D:
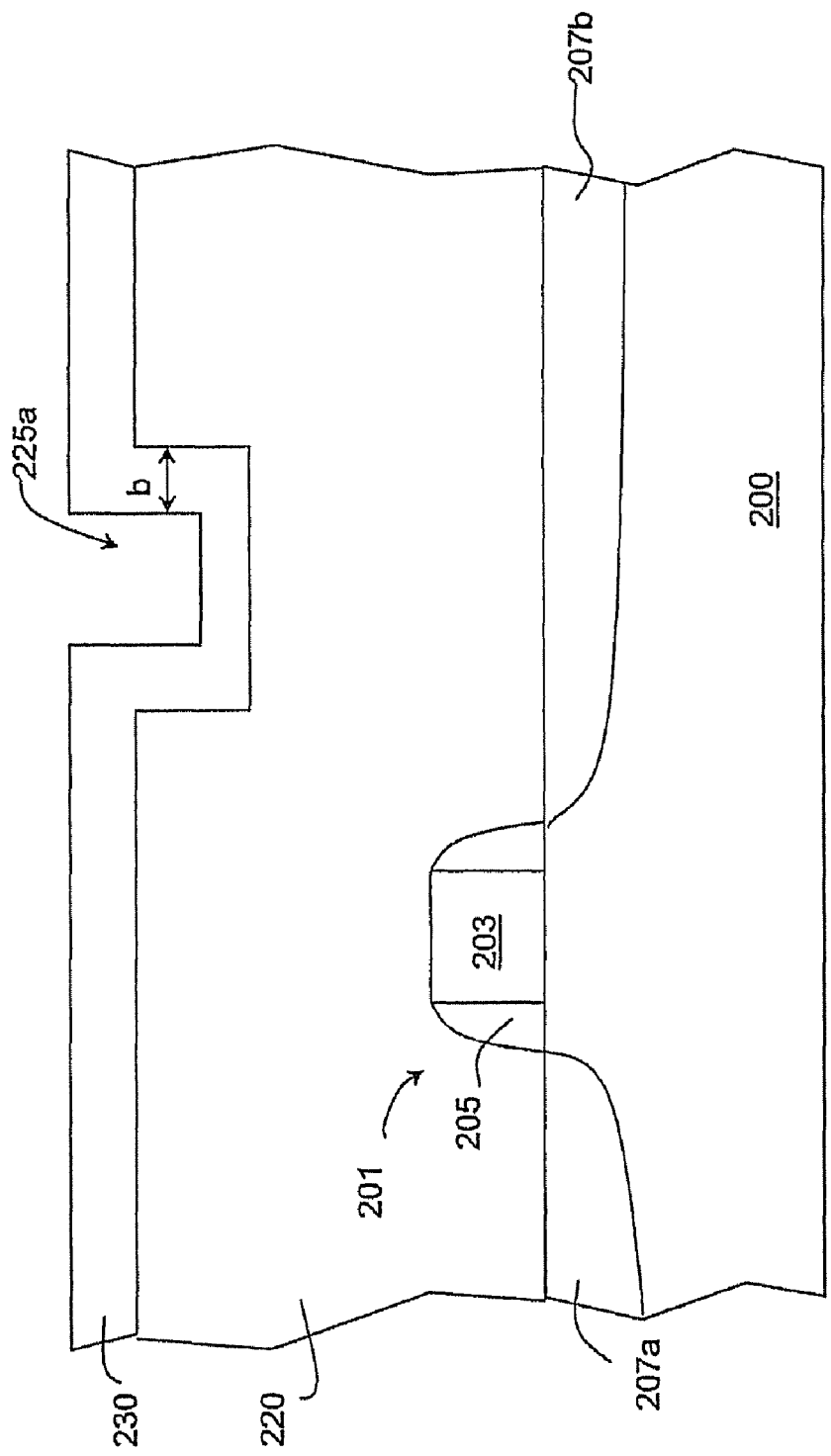

Referring to FIGS. 2C and 2D, a spacer material layer 230 is formed over the dielectric layer 220 and in the opening 225 resulting in opening 225a. In some embodiments, the spacer material layer 230 may be substantially conformal over the topography of the dielectric layer 220 including within original opening 225 as shown in FIG. 2D. In some embodiments, the spacer material layer 230 may be formed of a silicon oxide, a silicon nitride, an oxynitride, a silicon carbide, a polysilicon, a tantalum oxynitride (TaON), a tantalum pentoxide ($Ta_2O_5$), an aluminum oxide ($Al_2O_3$) or other spacer materials or various combinations thereof. In some embodiments, the spacer material layer 230 may be formed by CVD, atomic layer deposition (ALD) and/or physical vapor deposition (PVD). In some embodiments using 90-nm technology, the spacer material layer 230 may have a thickness "b" of about 100 nm or less.

Figure 2E:
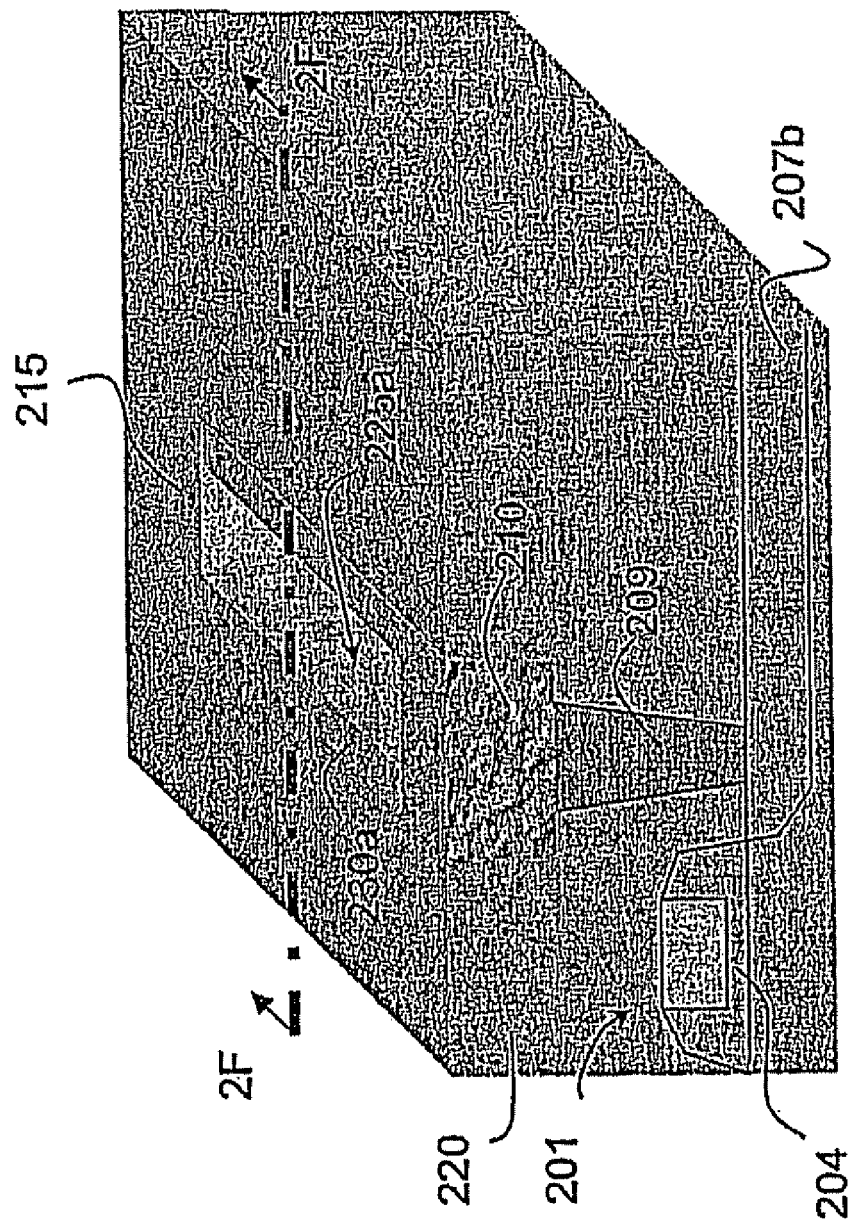
Figure 2F:
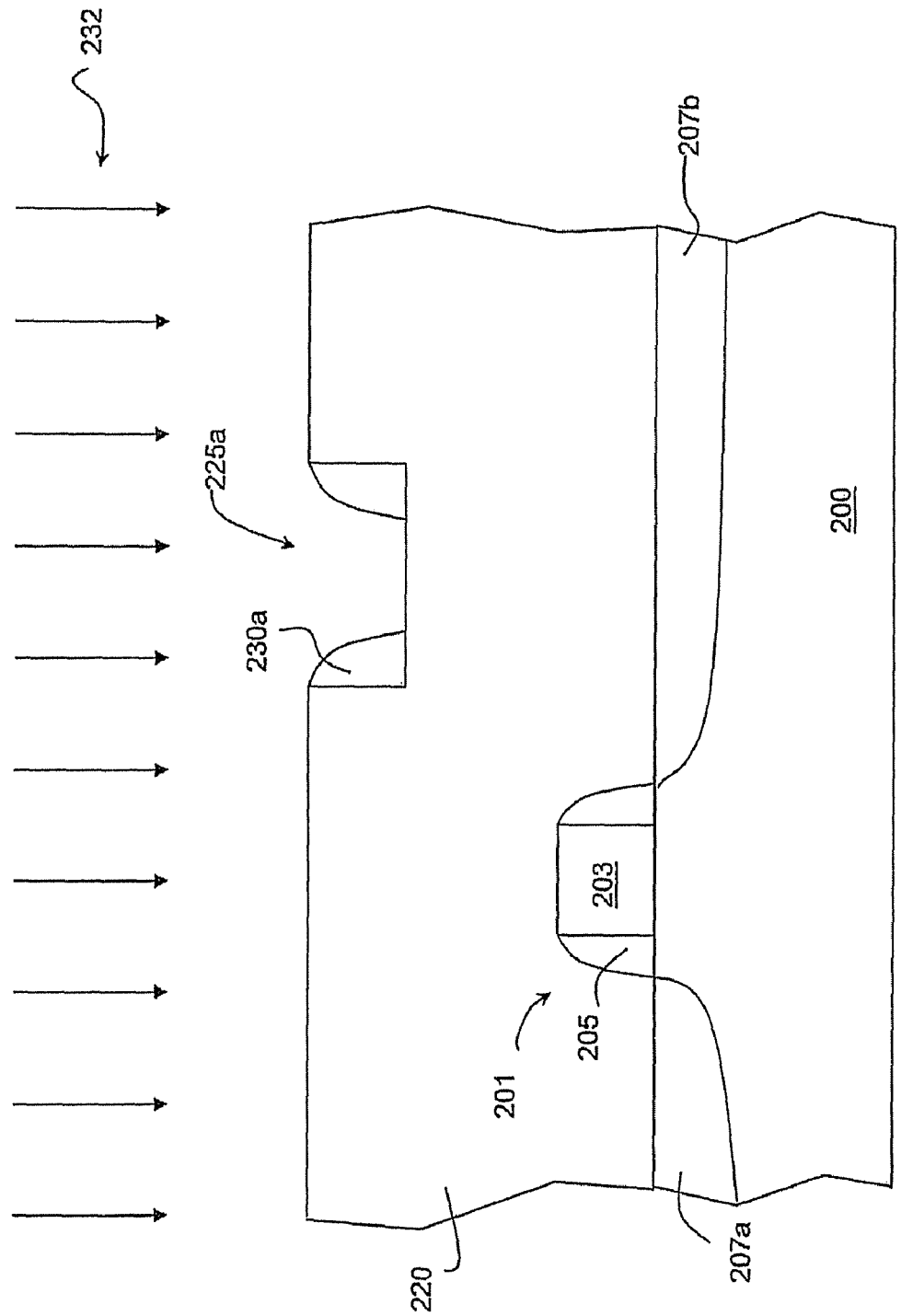

Referring to FIGS. 2E and 2F, a removal process 232 removes a portion of the spacer material layer 230 resulting in spacers 230a formed on sidewalls of the opening 225 and within the dielectric layer 220. The removal process 232 may include, for example, an etch-back process or another suitable process that substantially removes the spacer material layer 230 from over the top surface (not labeled) of the dielectric layer 220.

In some embodiments, an etching process may be used to remove spacers from sidewalls of the conductive structures 210, 215 that may be present in opening 225a. In this manner, a subsequent phase change material (PCM) layer 235 may be formed and contact the conductive structures 210, 215. The etch process (not shown) does not remove the spacers 230a formed on the sidewalls of the opening 225 within dielectric layer 220.

Figure 2G:
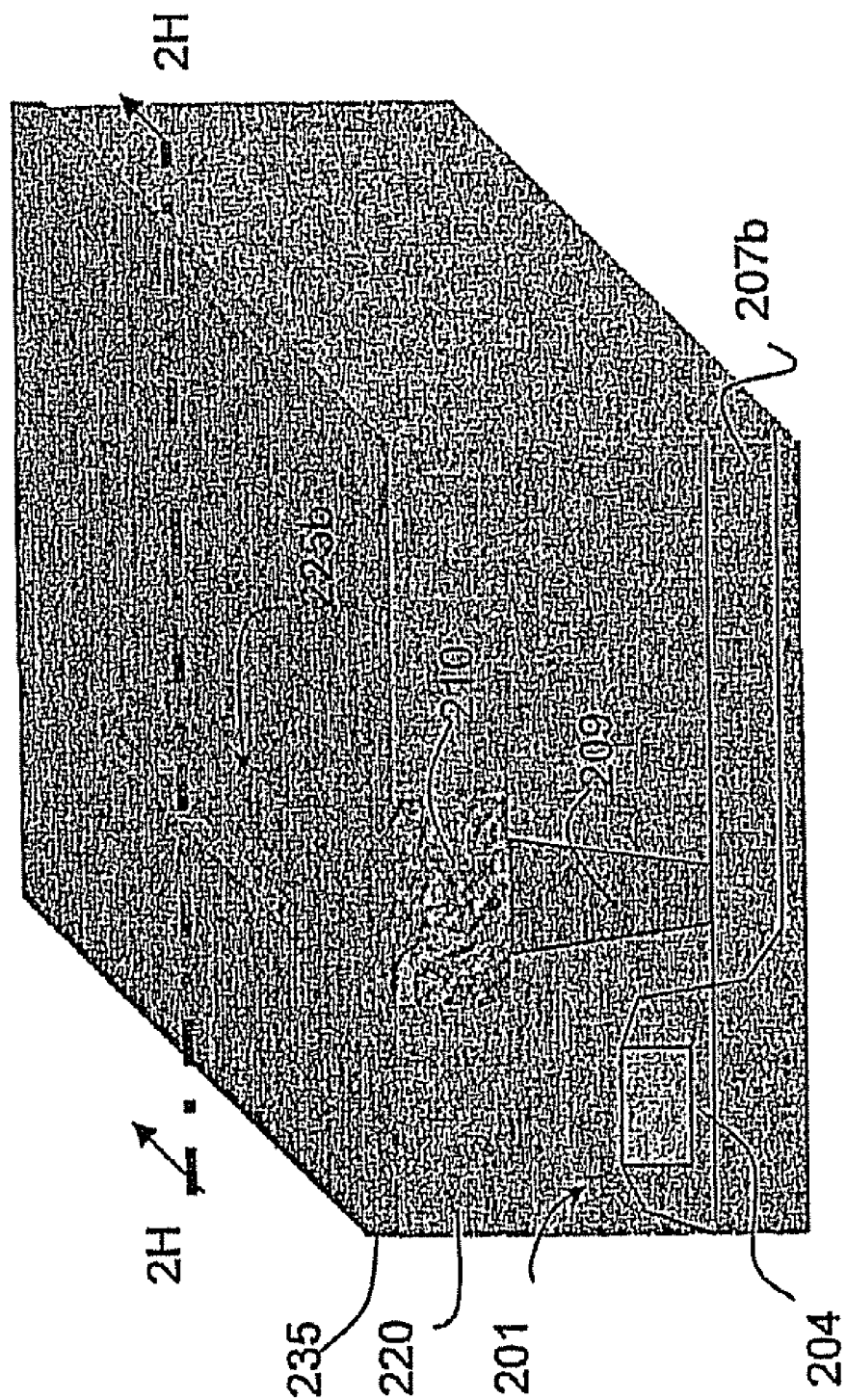
Figure 2H:
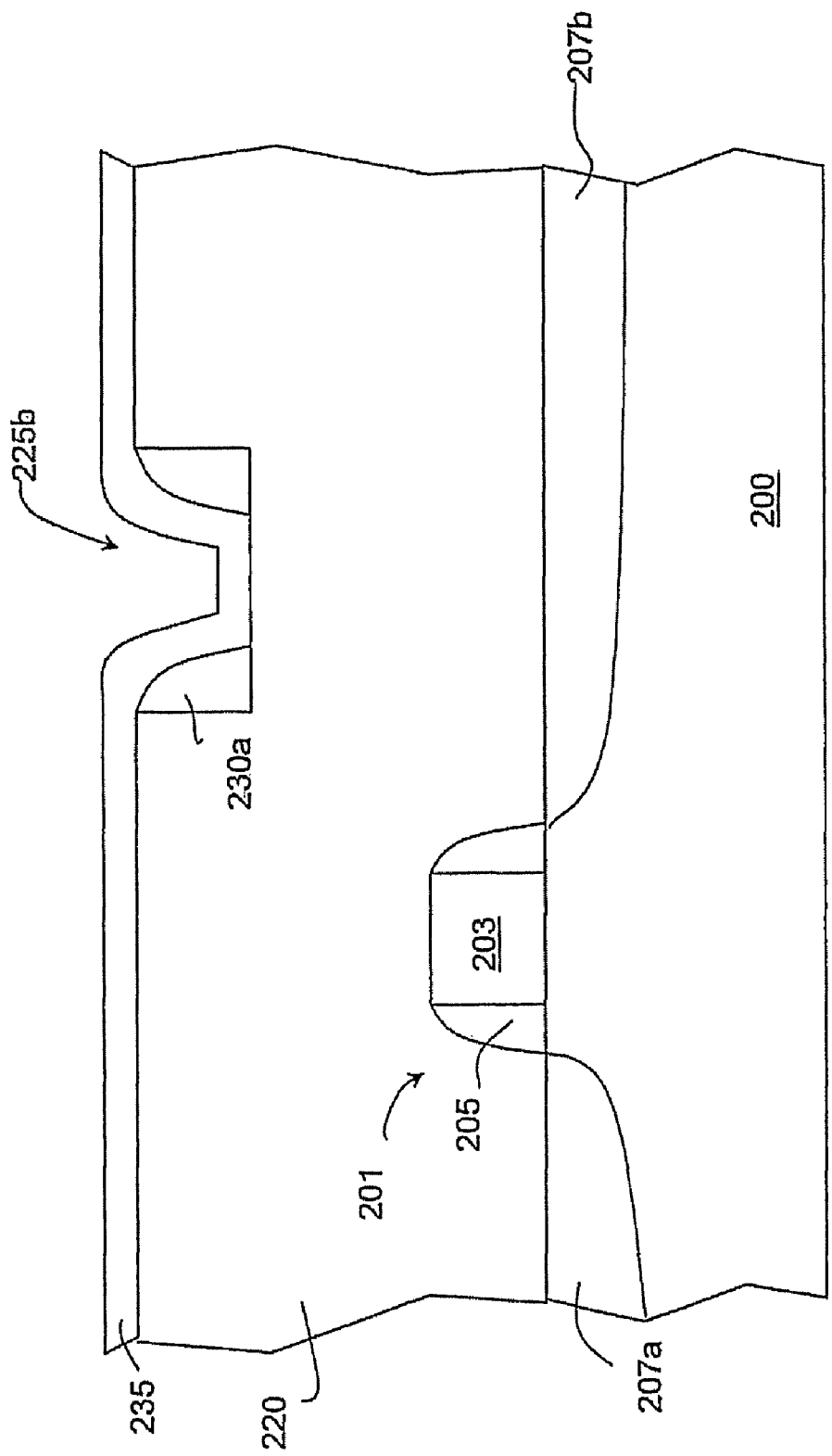

Referring to FIGS. 2G and 2H, a phase change material (PCM) layer 235 may be formed over the dielectric layer 220 including within opening 225a and over spacers 230a shown in FIGS. 2E and 2F resulting in opening 225b. In some embodiments, the PCM layer 235 may be substantially conformal over the topography of the structure shown in FIGS. 2E and 2F.

The PCM layer 235 may be a material comprising at least one of germanium-antimony-tellurium (GST), GST:N, GST:O and indium-silver-antimony-tellurium (InAgSbTe). The PCM layer 235 may be formed by, for example, a CVD process, a PVD process, an ALD process or another suitable process for forming a PCM layer, or combinations thereof. In some embodiments using 90-μm technology, the PCM layer 235 may have a thickness of about 90 nm or less.

In some embodiments, the PCM layer 235 may have different resistances in an amorphous state and a crystalline state. For example, the resistance of an amorphous PCM layer 235 may be a thousand time the resistance of a crystalline PCM layer 235.

Figure 2I:
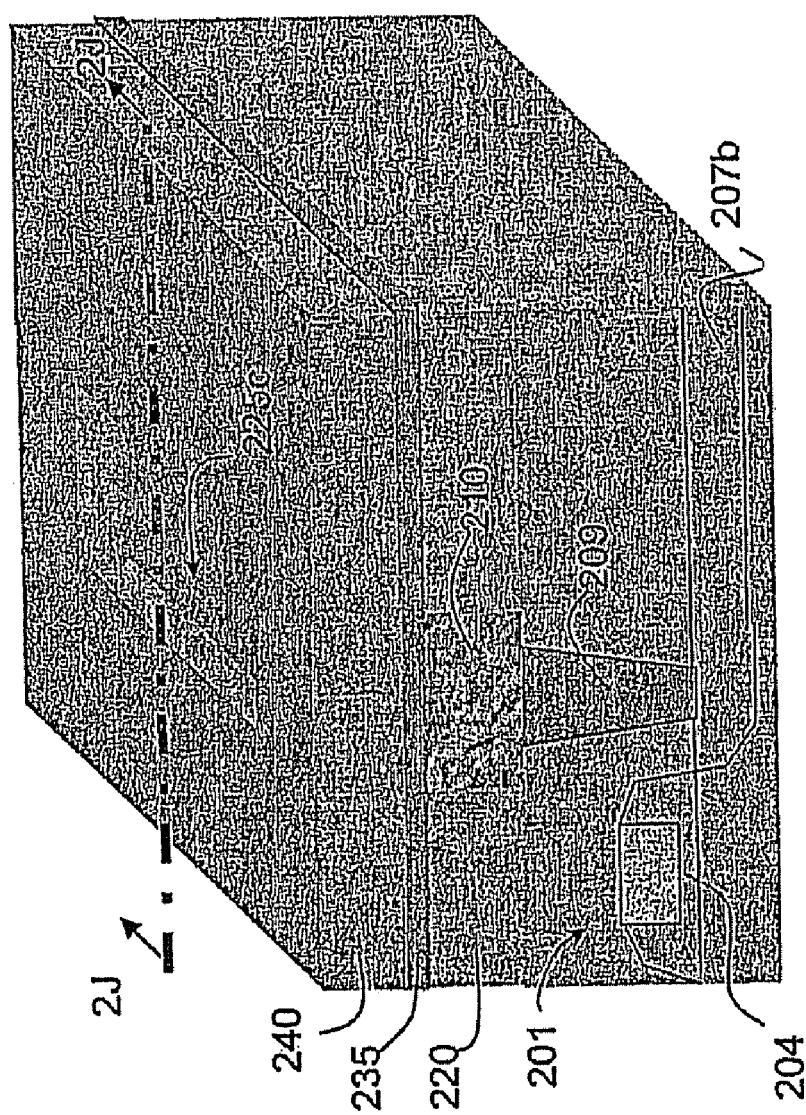
Figure 2J:
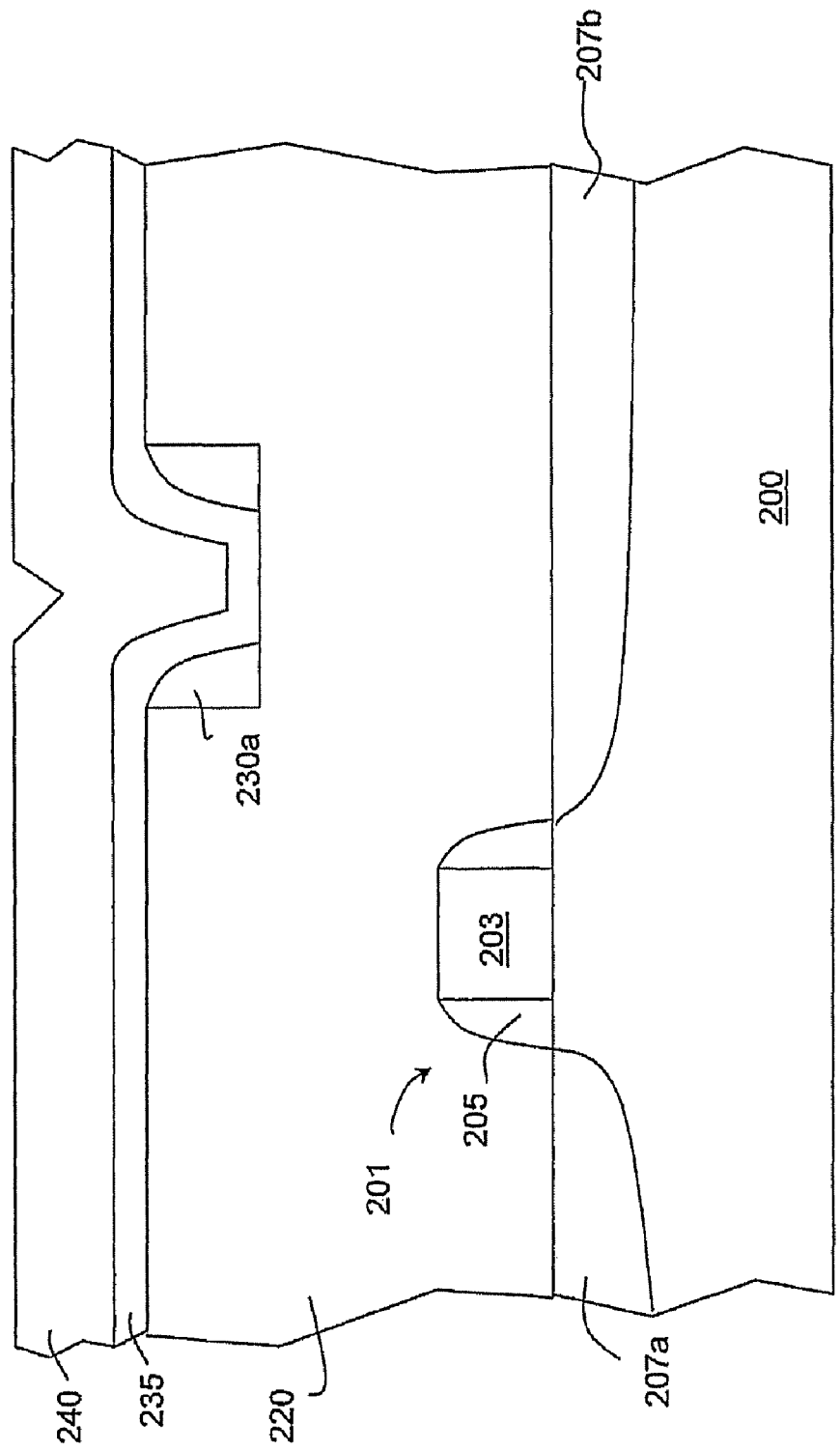

Referring to FIGS. 2I and 2J, a second dielectric layer 240 may be formed over the PCM layer 235. The second dielectric layer 240 may be, for example, a silicon oxide layer, a silicon nitride layer, an oxynitride layer, a silicon carbide layer, a polysilicon layer, a tantalum oxynitride (TaON) layer, a tantalum pentoxide ($Ta_2O_5$) layer, an aluminum oxide ($Al_2O_3$) layer, a low-k dielectric material layer, an ultra-low-k dielectric material layer, another dielectric material or combinations thereof. The second dielectric layer 240 may be formed using a plasma-enhanced CVD (PECVD) process, a spin-on-glass (SOG) process, an undoped silicate glass (USG) process, other processes that are adequate for forming a dielectric layer, or combinations thereof.

Figure 2K:
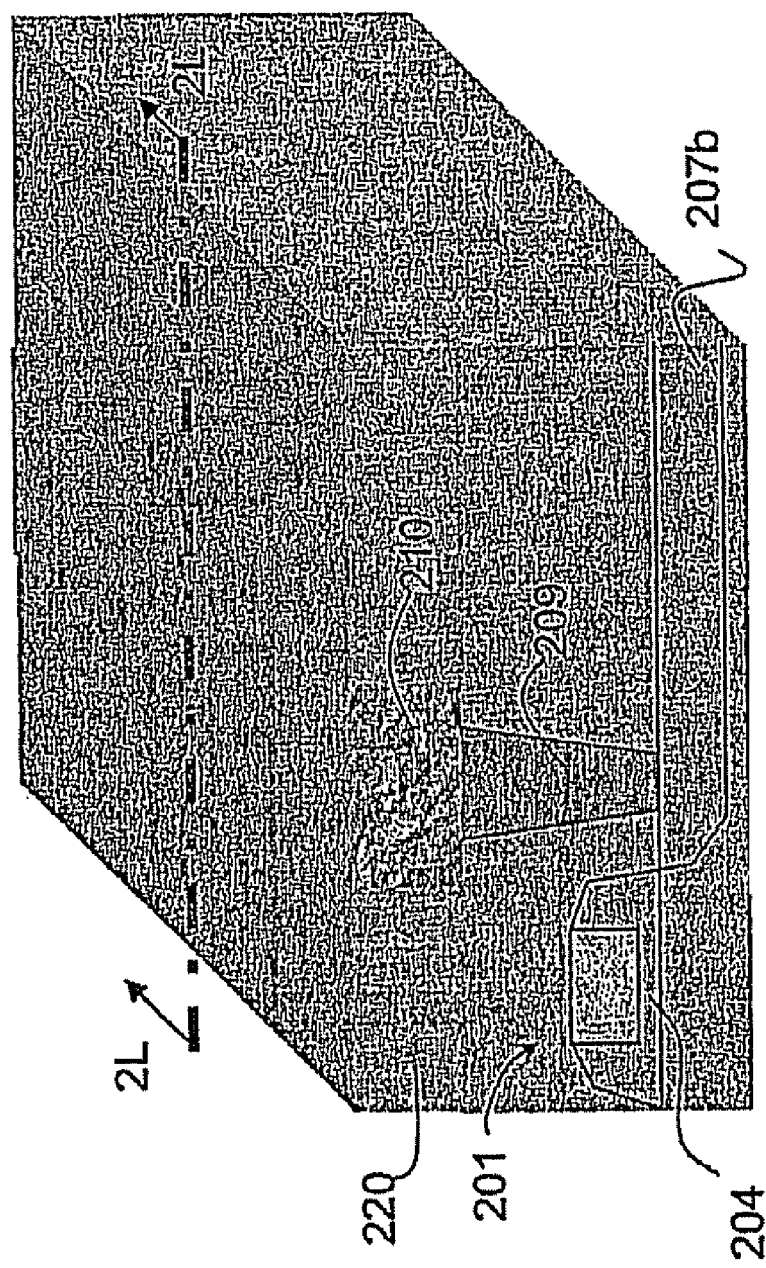
Figure 2L:
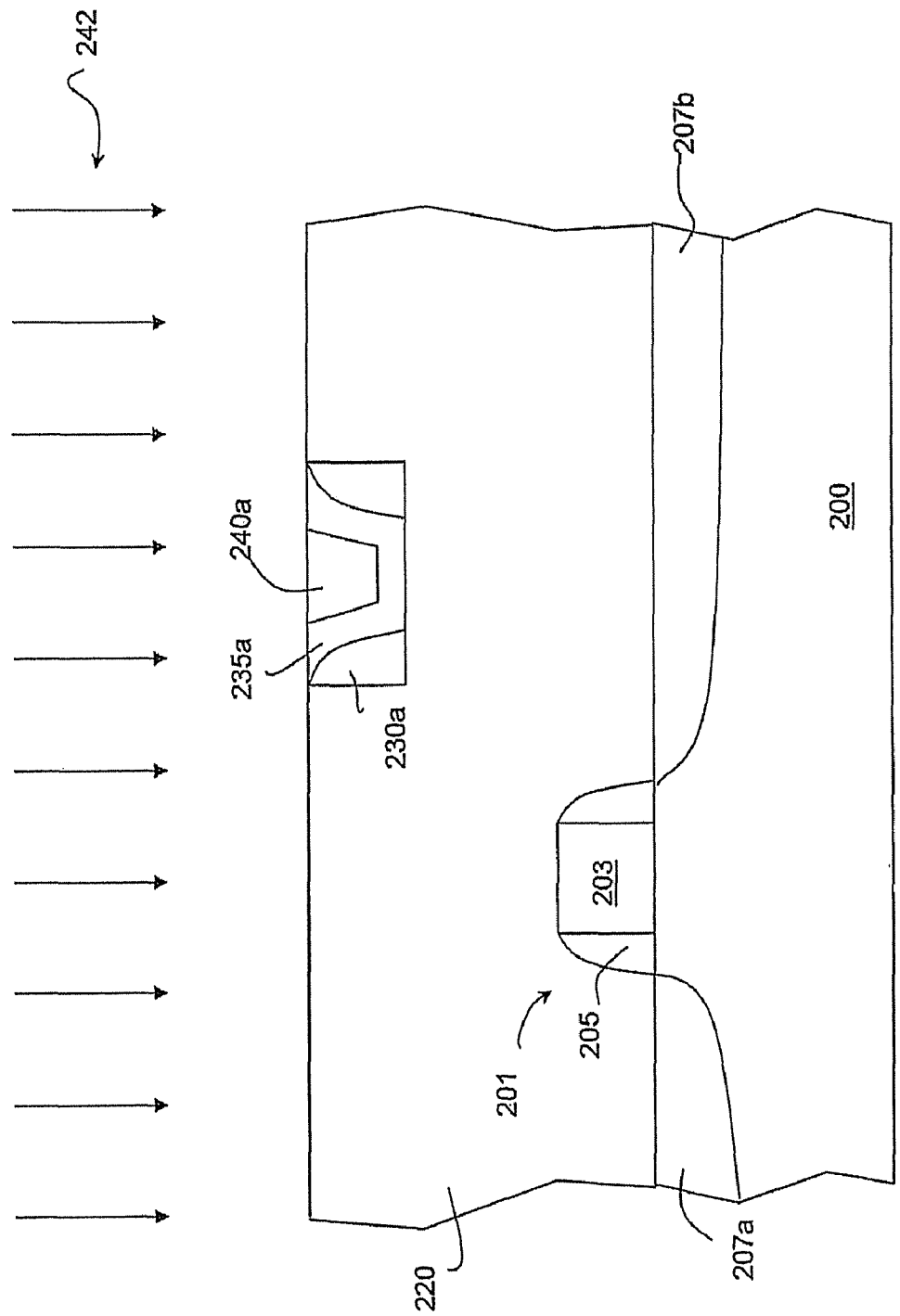

Referring to FIGS. 2K and 2L, a removal process 242 such as a chemical mechanical planarization (CMP) process may remove a portion of the second dielectric layer 240 and a portion of the PCM layer 235 so as to form a second dielectric layer 240a and a PCM layer 235a. The PCM layer 235a overlies the spacers 230a and laterally contacts the previously illustrated conductive structures 210, 215. The PCM layer 235a may laterally extend from the conductive structure 210 to the conductive structure 215. A bottom region of the PCM layer 235a may overly the dielectric layer 220. In some embodiments, the top surface (not labeled) of the PCM layer 235a may be substantially level with the top surface (not labeled) of the second dielectric layer 240a. The top surface (not labeled) of the second dielectric layer 240a may be substantially level with the top surface (not labeled) of the dielectric layer 220. By forming the spacers 230a, the cross-sectional area of the PCM layer 235a shown in FIG. 2L may be desirably reduced compared to that of a PCM layer of the same thickness formed in the original opening 225 shown in FIG. 2B. As such, the voltage or power required to be applied to the conductive structure 210 to transform the PCM layer 235, is reduced in comparison to the voltage/power that would be required to transform the bulk PCM layer formed within the opening 225 (shown in FIG. 2B) without the spacers 230a. Due to the low-power operation, the programming speed of the PCM cell may be desirably enhanced.

Figure 2M:
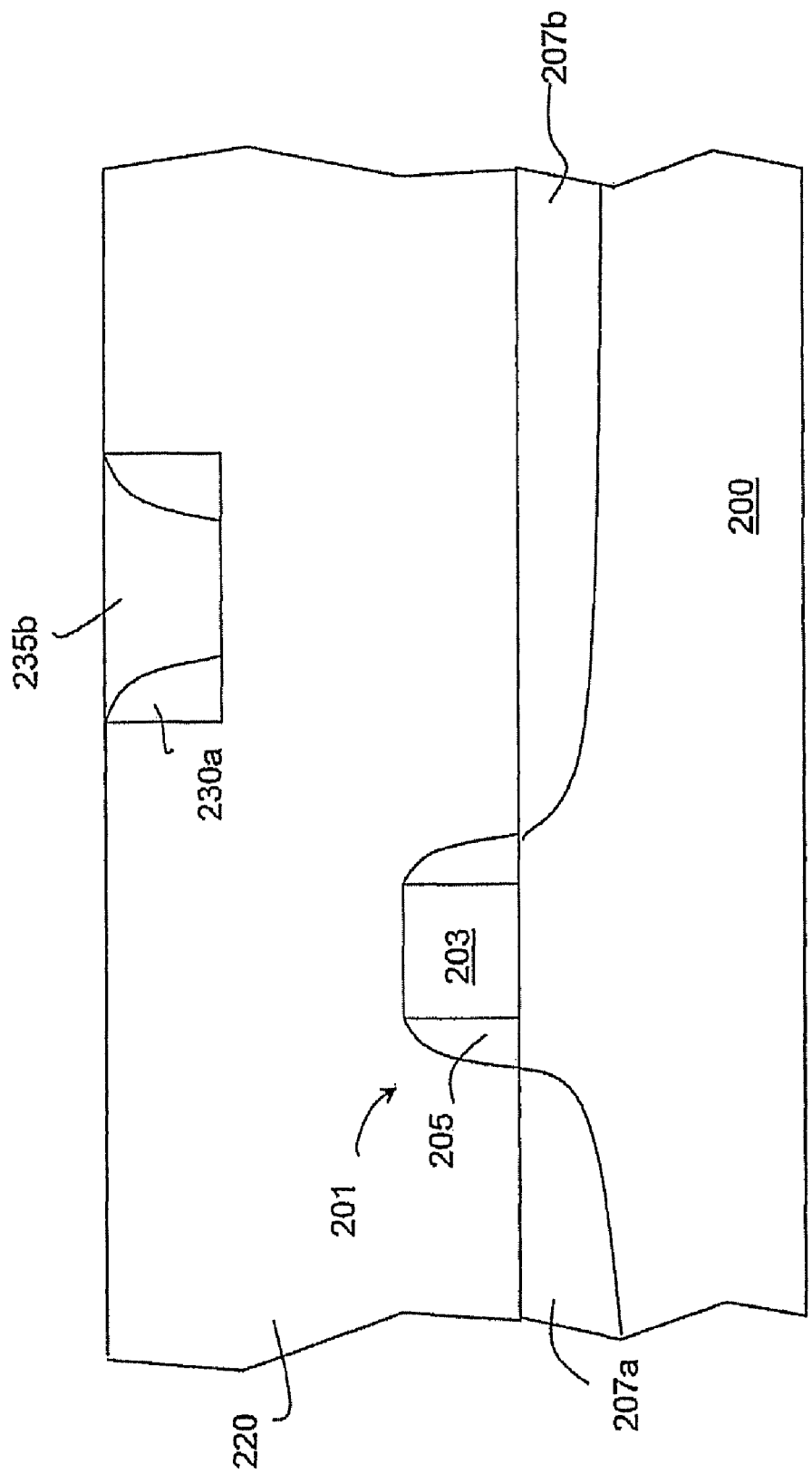
FIG. 2M is a cross-sectional view showing an exemplary phase change structure of a PCM cell.

In some embodiments, the PCM layer 235b may be formed overlying the spacers 230a without the dielectric layer 240a formed thereover as shown in FIG. 2M. The structure shown in FIG. 2M may be formed by, for example, forming a PCM layer (not shown) thicker than the PCM layer 235 so as to substantially fill the opening 225a shown in FIG. 2F. Without forming the dielectric layer 240a, the removal process 242 removes a portion of the PCM layer (not shown) so as to form the PCM layer 235b. The top surface (not labeled) of the PCM layer 235b may be substantially level with the top surface (not labeled) of the dielectric layer 220. Using this structure, the cross-sectional area of the PCM layer 235b shown in FIG. 2M may be desirably reduced compared to that of a PCM layer formed to fill the original opening 225 shown in FIG. 2B. As such, the voltage or power required to be applied to the conductive structure 210 to transform the PCM layer 235b, is reduced in comparison to the voltage/power that would be required to transform the bulk PCM layer formed to fill the opening 225 (shown in FIG. 2B) without the spacers 230a. Due to the low-power operation, the programming speed of the PCM cell may be desirably enhanced.

In some embodiments, the conductive structures 210, 215 are formed of the same material layer. One of the conductive structures 210, 215 is a first electrode and another of the conductive structures 210, 215 is a second electrode. Since the conductive structures 210, 215 may be formed by the same process, the horizontal phase change element does not require a further process for forming a top electrode as would a vertical phase change element. Accordingly, the process steps for forming a PCM cell is desirably reduced and mask layers may also desirably reduced.

By forming the spacers 230a on the sidewalls of the dielectric layer 220, the opening 225a (shown in FIG. 2F) may have a desired small scale in the bottom region. The desired small scale is beyond resolution limit of lithographic technology. For example, if the resolution capability of a scanner is 45 nm, the desired small scale can smaller than 45 nm, such as 32 nm which is a next generation of 45 nm technology node. Accordingly, the desired bottom region of the opening 225a can be achieved without using a photolithographic process to define the bottom dimension of the opening 225a.

FIGS. 3A-3G are schematic cross-sectional views showing another exemplary method for forming an exemplary PCM cell.

Figure 3A:
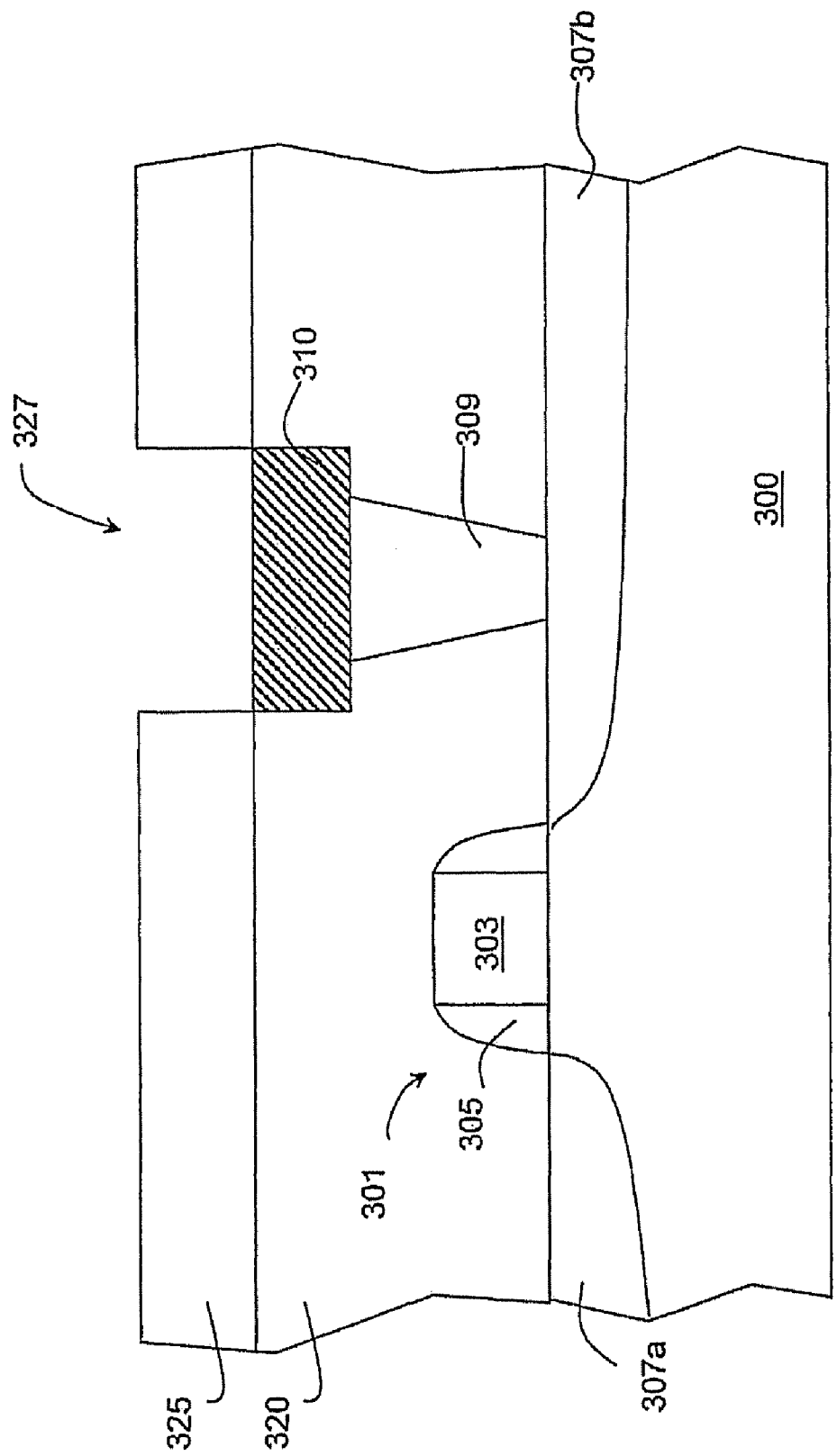
FIGS. 3A-3G are schematic cross-sectional views showing an exemplary method for forming an exemplary PCM cell.

Referring to FIG. 3A, a transistor 301 is formed over a substrate 300. At least one dielectric layer such as dielectric layer 320 is formed over the transistor 301. At least one conductive structure such as contact plug 309 and/or conductive structure 310 is formed within the dielectric layer 320. The contact plug 309 may electrically coupled to a contact region 307b of the transistor 301 and conductive structure 310 contacts contact plug 309 directly as illustrated or through an intervening barrier material (not shown). In some embodiments, the conductive structure 310 is an electrode of the PCM cell. The transistor 301 may comprise, for example, a gate 303 formed over the substrate 300. Although not illustrated, a gate dielectric of the transistor 301 is formed between gate 303 and the substrate 300. Spacers 305 are formed on sidewalls of the gate 303. The contact regions 307a, 307b are formed adjacent to the gate 303 or spacers 305 and within the substrate 300. The materials of and the methods for forming the substrate 300, gate 303, spacers 305, contact regions 307a, 307b, contact plug 309, conductive layer 310 and dielectric layer 320 are similar to those of substrate 200, gate 203, spacers 205, contact regions 207a, 207b, contact plug 209, conductive layer 210 and dielectric layer 220, respectively, described above in conjunction with FIGS. 2A and 2B.

A dielectric layer 325 is formed over the dielectric layer 320 and the conductive layer 310. The dielectric layer 325 may be a silicon oxide layer, a silicon nitride layer, an oxynitride layer, a low-k dielectric material layer, an ultra-low-k dielectric material layer, a layer of other dielectric materials, or combinations thereof. The dielectric layer 325 may be formed by using, for example, a plasma-enchanced CVD (PECVD) process, a spin-on-glass (SOG) process, an undoped silicate glass (USG) process or another suitable process for forming a dielectric layer, or combinations thereof.

An opening 327 is formed within the dielectric layer 325 and exposes conductive structure 310. The opening 327 may be formed by a photolithographic process forming a patterned photoresist layer (not shown) having an opening (not shown) corresponding to the opening 327. An etch process uses the patterned photoresist layer as a mask and removes a portion of the dielectric layer 325 so as to form opening 327 in the dielectric layer 325. After the etch process, the patterned photoresist layer may be removed by, for example, a photolithographic removal process. In some embodiments, the width of the opening 327 may be substantially equal to the width of the conductive structure 310.

Figure 3B:
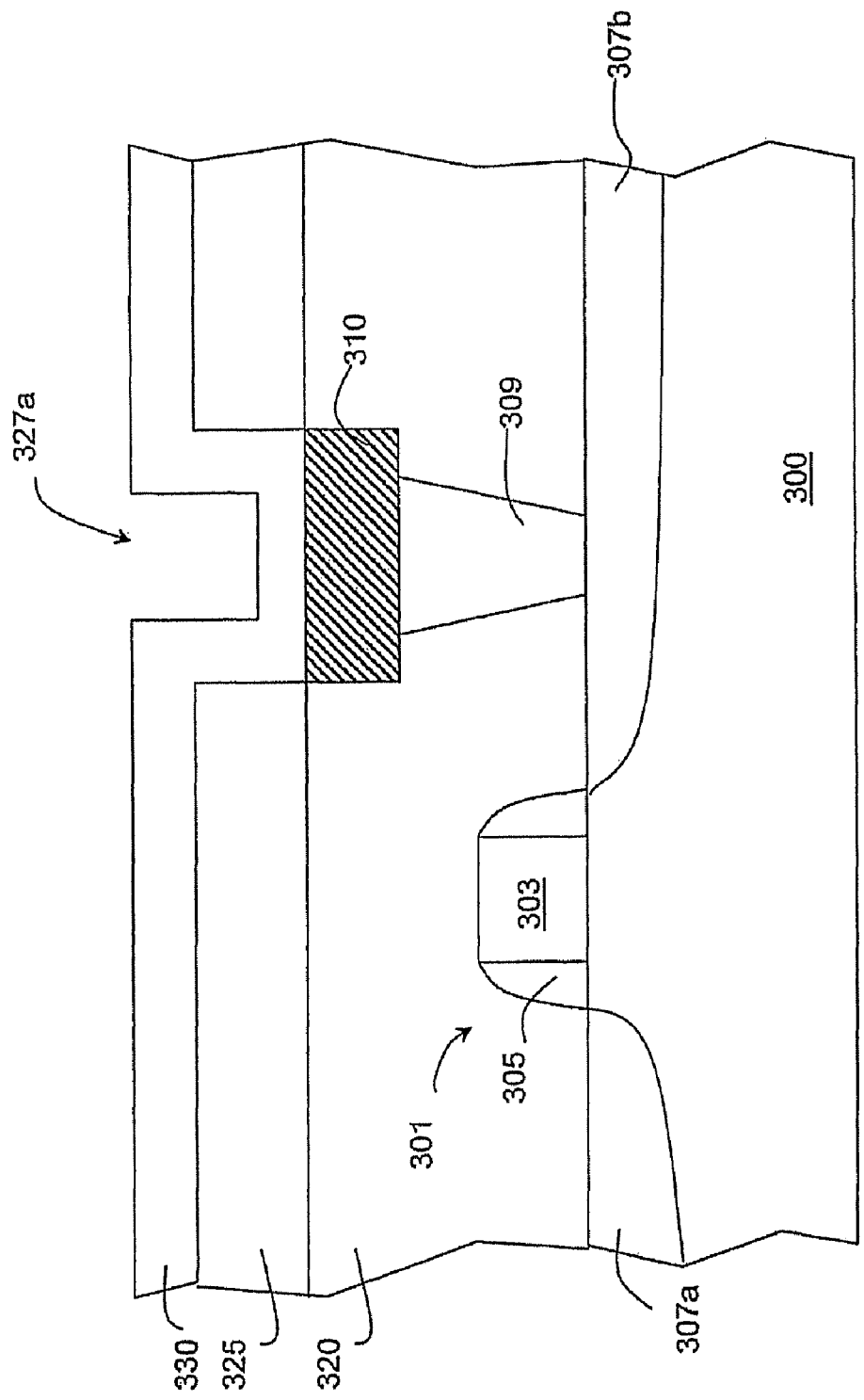

Referring to FIG. 3B, a conductive layer 330 is formed over the dielectric layer 325 and in opening 327 to produce the opening 327a. In some embodiments, the conductive layer 330 may be substantially conformal over the topography of the dielectric layer 325. The conductive layer 330 may be formed of, for example, a material comprising at least one of a metallic material (e.g., titanium tungsten (TiW), W, platinum (Pt), platinum iridium (PtIr), copper (Cu), aluminum (Al), AlCu, aluminum silicon copper (AlSiCu) or other metallic materials); a metallic nitride (e.g., titanium nitride (TiN), tantalum nitride (TaN), titanium silicon nitride (TiSiN), titanium aluminum nitride (TiAlN), titanium carbon nitride (TiCN), tantalum silicon nitride (TaSiN), tantalum aluminum nitride (TaAlN), tungsten nitride (WN) or other metallic nitrides); a metallic silicide (e.g., titanium silicide (TiSi$_x$), nickel silicide (NSi$_x$), cobalt silicide (CoSi$_x$) or other metallic silicides); a conductive oxide (e.g., iridium oxide (IrO$_2$), ruthenium oxide (RuO$_2$), iridium ruthenium oxide (IrRuO$_3$), lithium niobate (LiNbO$_3$) or other conductive oxides) or of composite material layers (e.g., Ti/TiN, Ta/TaN, TiN/W, TaN/Ta/Cu or other composite material layer). In some embodiments using 90-nm technology, the conductive layer 330 may have a thickness between about 20 nanometers (nm) and about 200 nm. In some embodiments, the conductive layer 330 may have a thermal conductivity less than that of the conductive layer 310.

Figure 3C:
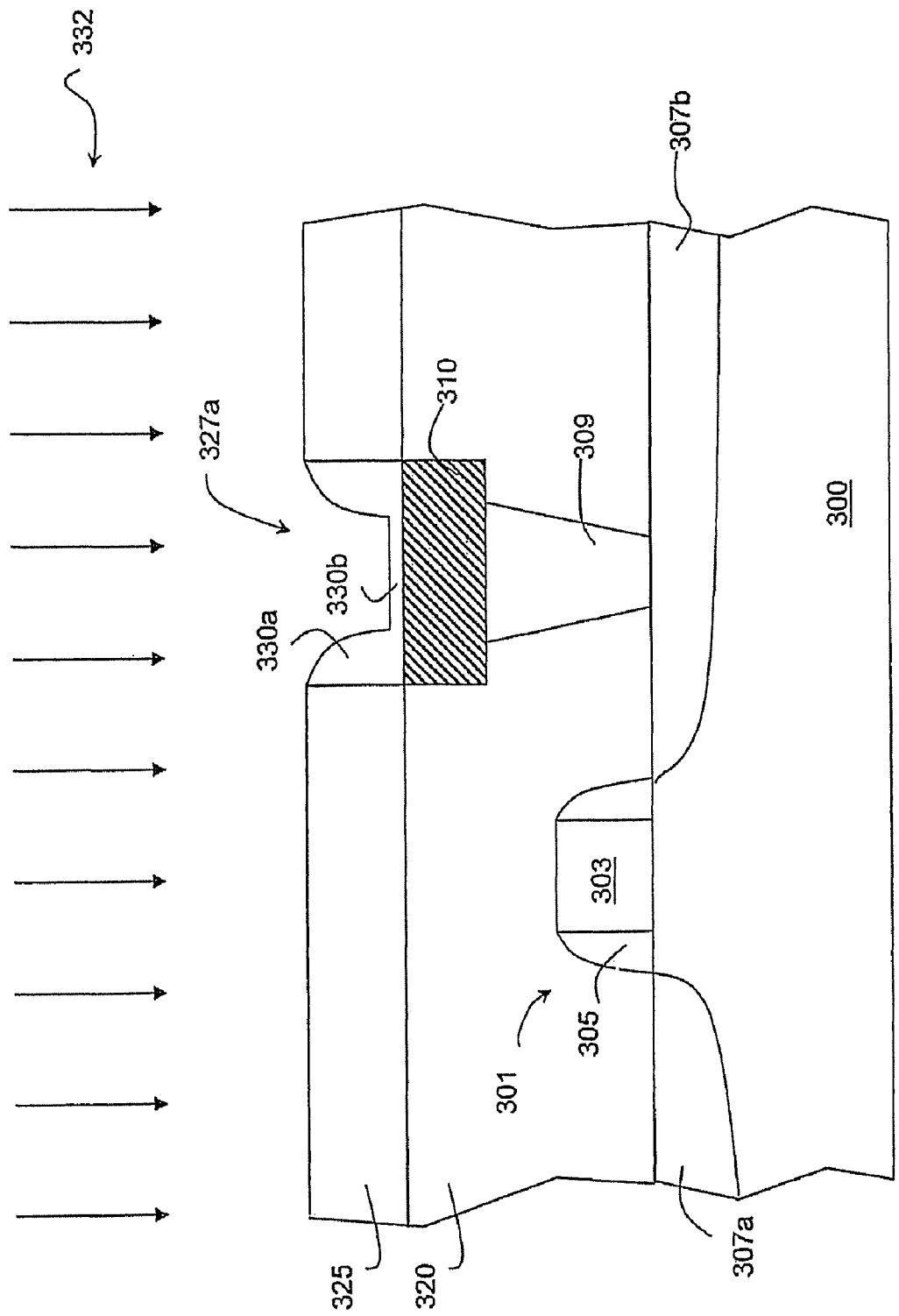

Referring to FIG. 3C, a removal process 332 such as an etch-back process or CMP process may remove a portion of the conductive layer 330 so as to form spacers 330a on the sidewalls of the dielectric layer 325. In some embodiments, a remaining conductive portion 330b is present, overlying the conductive layer 310. In other embodiments, the conductive portion 330b may be removed, such that the top surface of the conductive layer 310 is exposed.

Figure 3D:
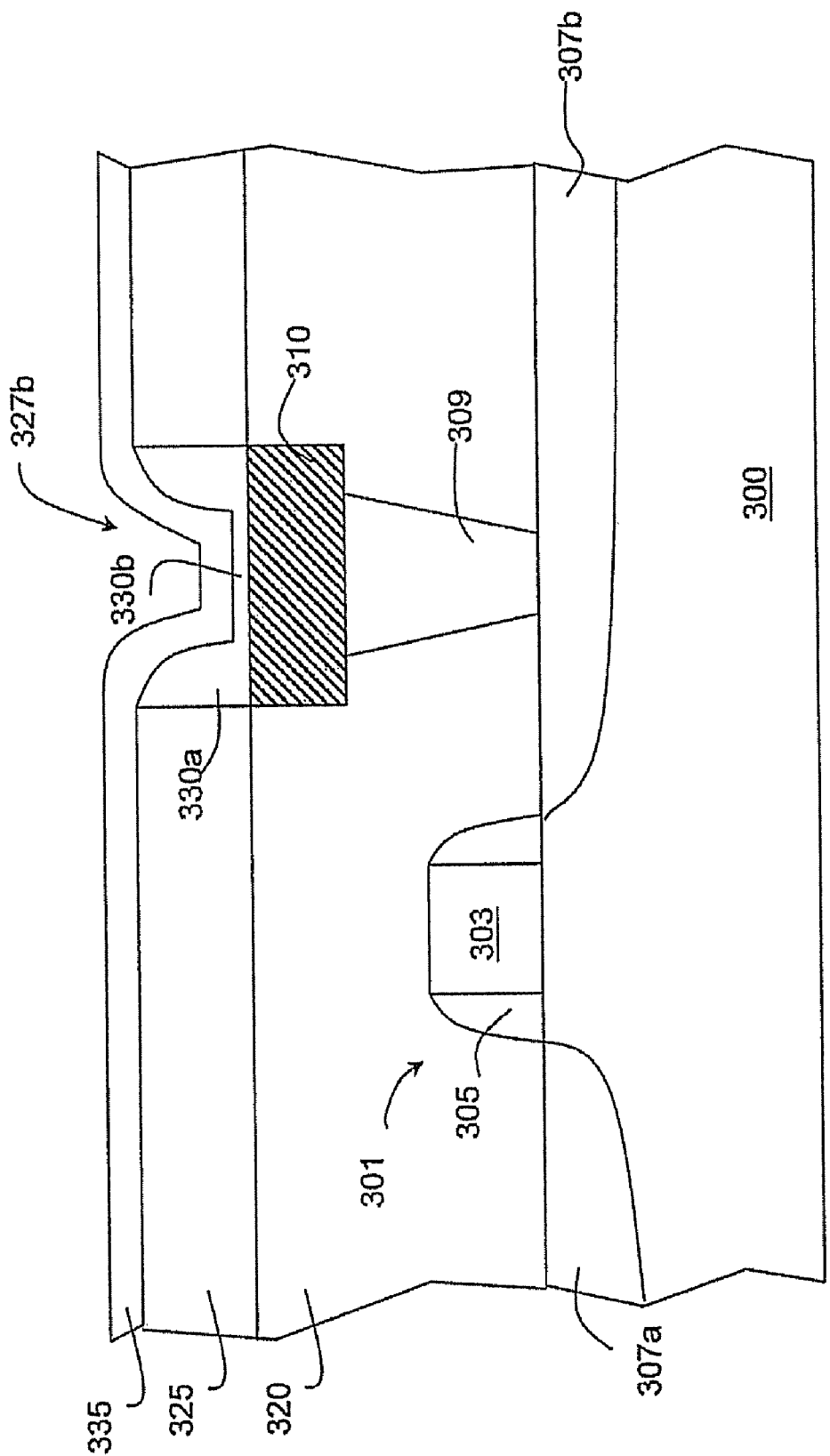

Referring to FIG. 3D, a phase change material (PCM) layer 335 may be formed over the dielectric layer 325 and the conductive spacers 330a so as to form the opening 327b. In some embodiments, the PCM layer 335 may be substantially conformal over the topography of the dielectric layer 325 and the conductive spacers 330a as shown in FIG. 3C. The material of and the method for forming the PCM layer 335 may be similar to those of the PCM layer 235 described above in conjunction with FIGS. 2G and 2H. In some embodiments, the PCM layer 235 may overly the optional conductive portion 330b.

Figure 3E:
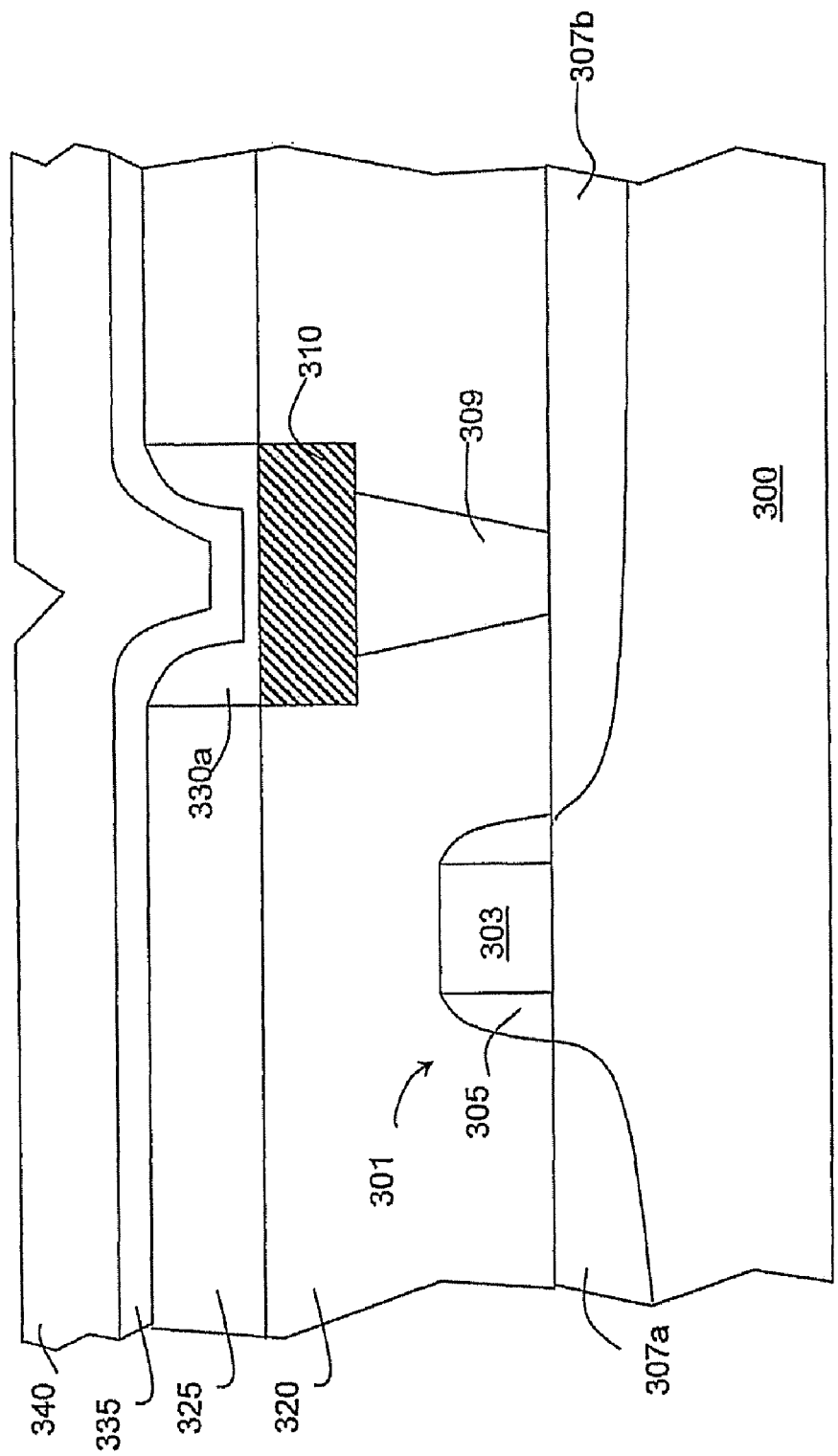

Referring to FIG. 3E, a dielectric layer 340 may be formed over the PCM layer 335. The dielectric layer 340 may be, for example, an oxide layer, a nitride layer, an oxynitride layer, a low-k dielectric material layer, an ultra-low-k dielectric material layer, a layer of other dielectric materials, or combinations thereof. The dielectric layer 340 may be formed by, for example, a plasma-enhanced CVD (PECVD) process, a spin-on-glass (SOG) process, an undoped silicate glass (USG) process or other suitable processes for forming the dielectric layer or combinations thereof.

Figure 3F:
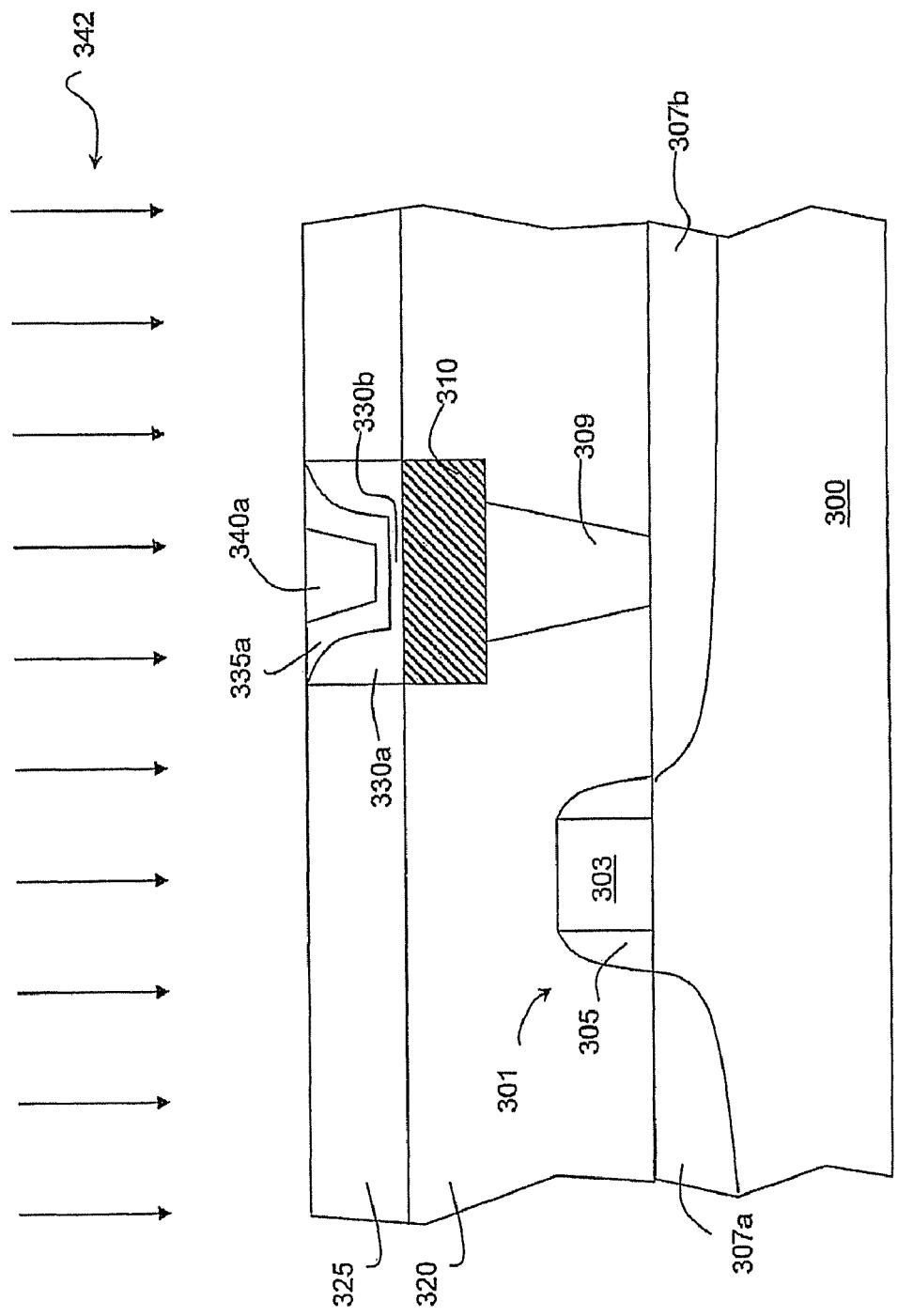

Referring to FIG. 3F, a removal process 342 such as a chemical mechanical planarization (CMP) process may remove a portion of the dielectric layer 340 and a portion of the PCM layer 335 so as to form a dielectric layer 340a and a PCM layer 335a. The PCM layer 335a may overlie the spacers 330a and the conductive portion 330b. In some embodiments, the top surface (not labeled) of the PCM layer 335a may be substantially level with the top surface (not labeled) of the dielectric layer 340a. The top surface (not labeled) of the dielectric layer 340a may be substantially level with the top surface (not labeled) of the dielectric layer 325. By forming the spacers 330a, the cross-sectional area of the PCM layer 335a shown in FIG. 3F may be desirably reduced compared to that of a PCM layer of the same thickness formed in the original opening 327 shown in FIG. 3A. As such, the voltage or power required to be applied to the conductive structure 310 to transform the PCM layer 335a, is reduced in comparison to the voltage/power that would be required to transform the bulk PCM layer formed within the opening 327 (shown in FIG. 3A) without the spacers 330a. Due to the low-power operation, the programming speed of the PCM cell may be desirably enhanced.

Figure 3G:
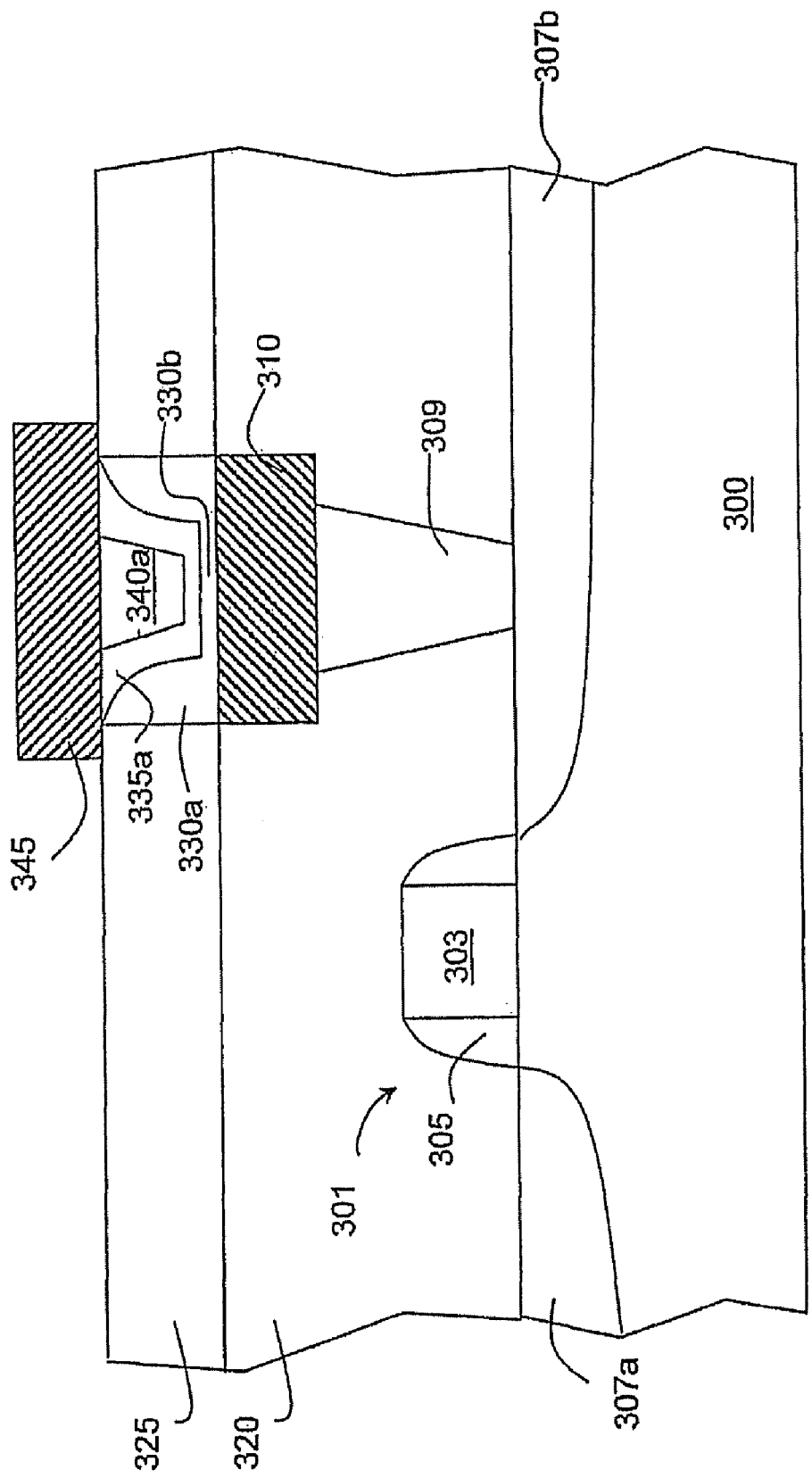

Referring to FIG. 3G, a conductive structure 345 may be formed over the PCM layer 335a. In some embodiments, the conductive structure 345 may be referred to as a top electrode of a PCM cell. The conductive structure 345 may comprise, for example, a material comprising at least one of a metallic material (e.g., titanium tungsten (TiW), W, platinum (Pt), platinum iridium (PtIr), copper (Cu), aluminum (Al), AlCu, aluminum silicon copper (AlSiCu) or other metallic materials); a metallic nitride (e.g., titanium nitride (TiN), tantalum nitride (TaN), titanium silicon nitride (TiSiN), titanium aluminum nitride (TiAlN), titanium carbon nitride (TiCN), tantalum silicon nitride (TaSiN), tantalum aluminum nitride (TaAlN), tungsten nitride (WN) or other metallic nitrides); a metallic silicide (e.g., titanium silicide (TiSi$_x$), nickel silicide (NSi$_x$), cobalt silicide (CoSi$_x$) or other metallic silicides); a conductive oxide (e.g., iridium oxide (IrO$_2$), ruthenium oxide (RuO$_2$), iridium ruthenium oxide (IrRuO$_3$), lithium niobate (LiNbO$_3$) or other conductive oxides) and it may be include composite material layers (e.g., Ti/TiN, Ta/TaN, TiN/W, TaN/Ta/Cu or other composite material layer). In some embodiments, the conductive structure 345 may be formed by, for example, a CVD process, a PVD process, an ALD process, an electrochemical plating process, an electroless plating process, other thin film deposition processes or various combinations thereof.

In some embodiments, the PCM layer 335b may be formed overlying the spacers 330a without the dielectric layer 340a shown in FIG. 3F, formed thereover. The structure shown in FIG. 3H may be formed by, for example, forming a PCM layer (not shown) thicker than the PCM layer 335 so as to substantially fill the opening 327a shown in FIG. 3C. Without forming the dielectric layer 340a, the removal process 342 removes a portion of the PCM layer (not shown) so as to form the PCM layer 335b. The top surface (not labeled) of the PCM layer 335b may be substantially level with the top surface (not labeled) of the dielectric layer 325.

Figure 3H:
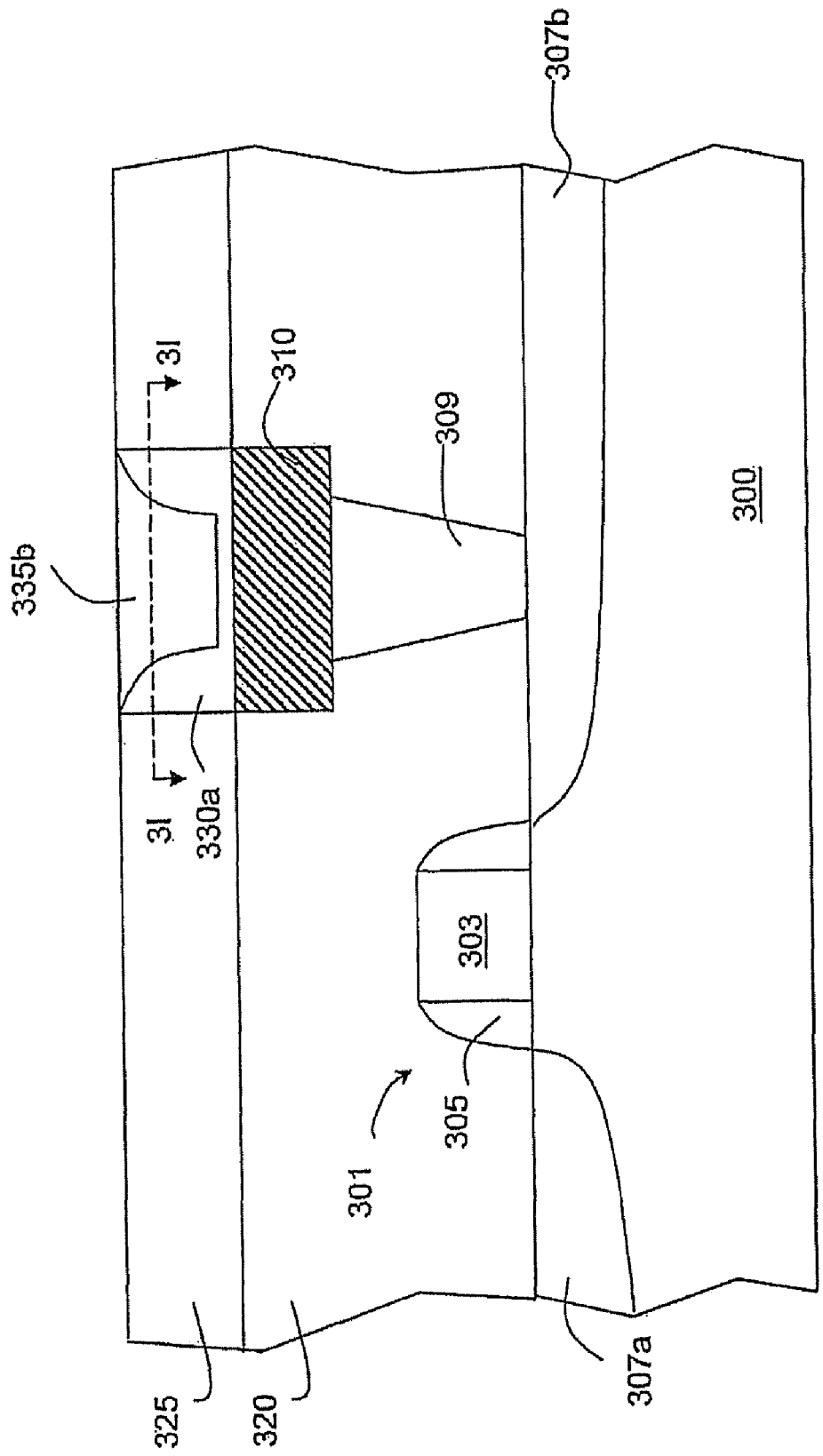
FIG. 3H is a cross-sectional view showing an exemplary phase change structure of a PCM cell.

Using this structure, the cross-sectional area of the PCM layer 335b shown in FIG. 3H may be desirably reduced compared to that of a PCM layer formed to fill the original opening 327 shown in FIG. 3A. As such, the voltage or power required to be applied to the conductive structure 310 to transform the PCM layer 335b, is reduced in comparison to the voltage/power that would be required to transform the bulk PCM layer formed to fill the opening 327 (shown in FIG. 3A) without the spacers 330a. Due to the low-power operation, the programming speed of the PCM cell may be desirably enhanced.

In some embodiments, the spacers 330a may have a desired thermal conductivity such that heat generated in the PCM layer 335a would be prevented from transmitting to the conductive layer 310 and may desirably remain in the PCM layer 335a, such that the PCM layer 335a may be desirably transformed.

Figure 3J:
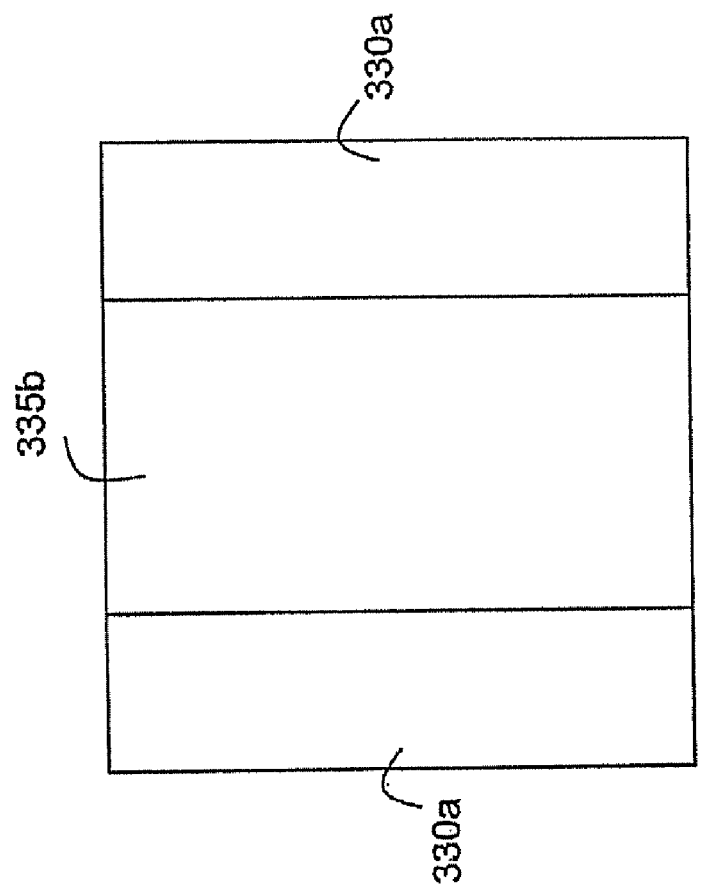
FIGS. 3I and 3J are sectional views of the phase change element of FIG. 3H taken along a section line 3I.
Figure 3I:
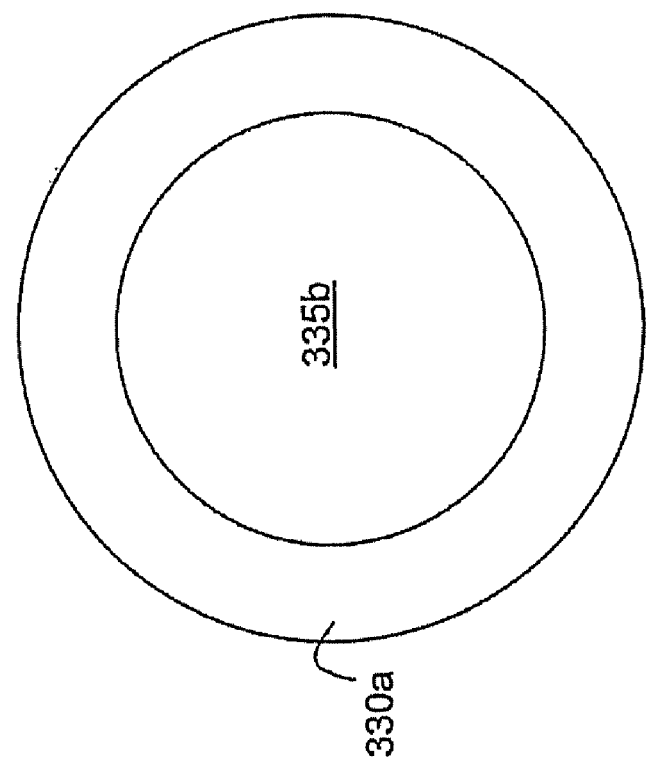

FIGS. 3I and 3J are top, cross-sectional views of two embodiments of the phase change element of FIG. 3H as may be taken along line 3I-3I. Referring to FIG. 3I, a top view of the phase change element shows that the conductive spacers 330a extend circumferentially around the PCM layer 335b. Referring to FIG. 3J, a top view of the phase change element shows that the PCM layer 335b is between the conductive spacers 330a. The PCM layer 335b may be substantially parallel to the conductive spacers 330a.

FIGS. 4A-4J are schematic cross-sectional views showing an exemplary method for forming an exemplary PCM cell.

Figure 4A:
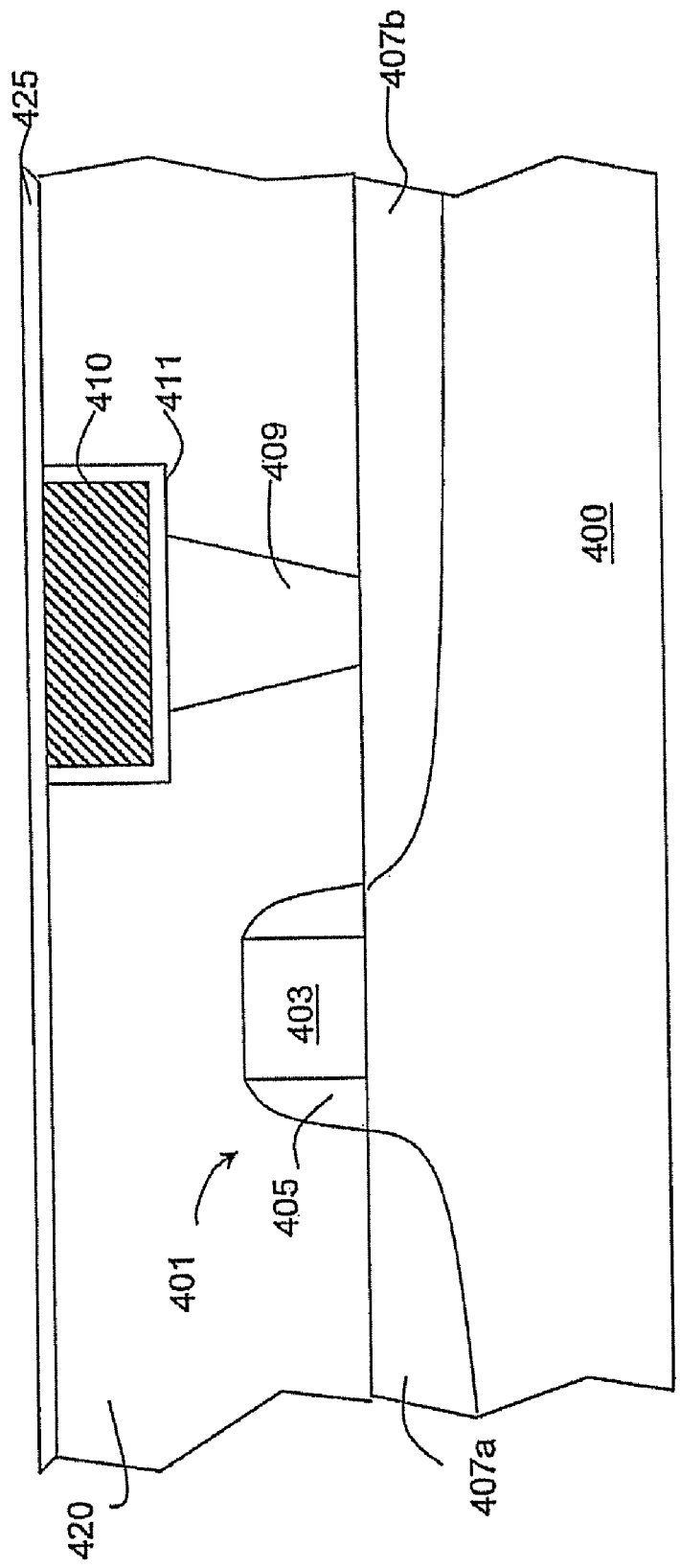
FIGS. 4A-4J are schematic cross-sectional views showing a sequence of steps in an exemplary method for forming an exemplary PCM cell.

Referring to FIG. 4A, a transistor 401 is formed over a substrate 400. At least one dielectric layer such as dielectric layer 420 is formed over the transistor 401. At least one conductive structure such as contact plug 409 and conductive structure 410 is formed within the dielectric layer 420. Although not illustrated, a gate dielectric of the transistor 401 is formed between gate 403 and the substrate 400. In some embodiments, at least one barrier layer such as barrier layer 411 is formed over the contact plug 409 and in other exemplary embodiments, conductive structure 410 may contact the contact plug 409 directly. The contact plug 409 may electrically coupled to a contact region 407b of the transistor 401. In some embodiments, the conductive structure 410 is referred to as a bottom electrode of the PCM cell. An etch-stop layer 425 is formed over the conductive structure 410. The transistor 401 may comprise, for example, a gate 403 formed over the substrate 400. Spacers 405 are formed on sidewalls of the gate 403. The contact regions 407a, 407b are formed adjacent to the gate 403 or spacers 405 and within the substrate 400. The materials of and the methods for forming the substrate 400, gate 403, spacers 405, contact regions 407a, 407b, contact plug 409, conductive structure 410 and dielectric layer 420 are similar to those of substrate 200, gate 203, spacers 205, contact regions 207a, 207b, contact plug 209, conductive layer 210 and dielectric layer 220, respectively, described above in conjunction with FIGS. 2A and 2B.

The barrier layer 411 may be a Ta layer, TaN layer, Ti layer, TiN layer, other metallic material layer or various combinations thereof. In some embodiments, the barrier layer 411 may be formed by, for example, a CVD process, a PVD process, an ALD process, other thin film processes or various combinations thereof.

Figure 4B:
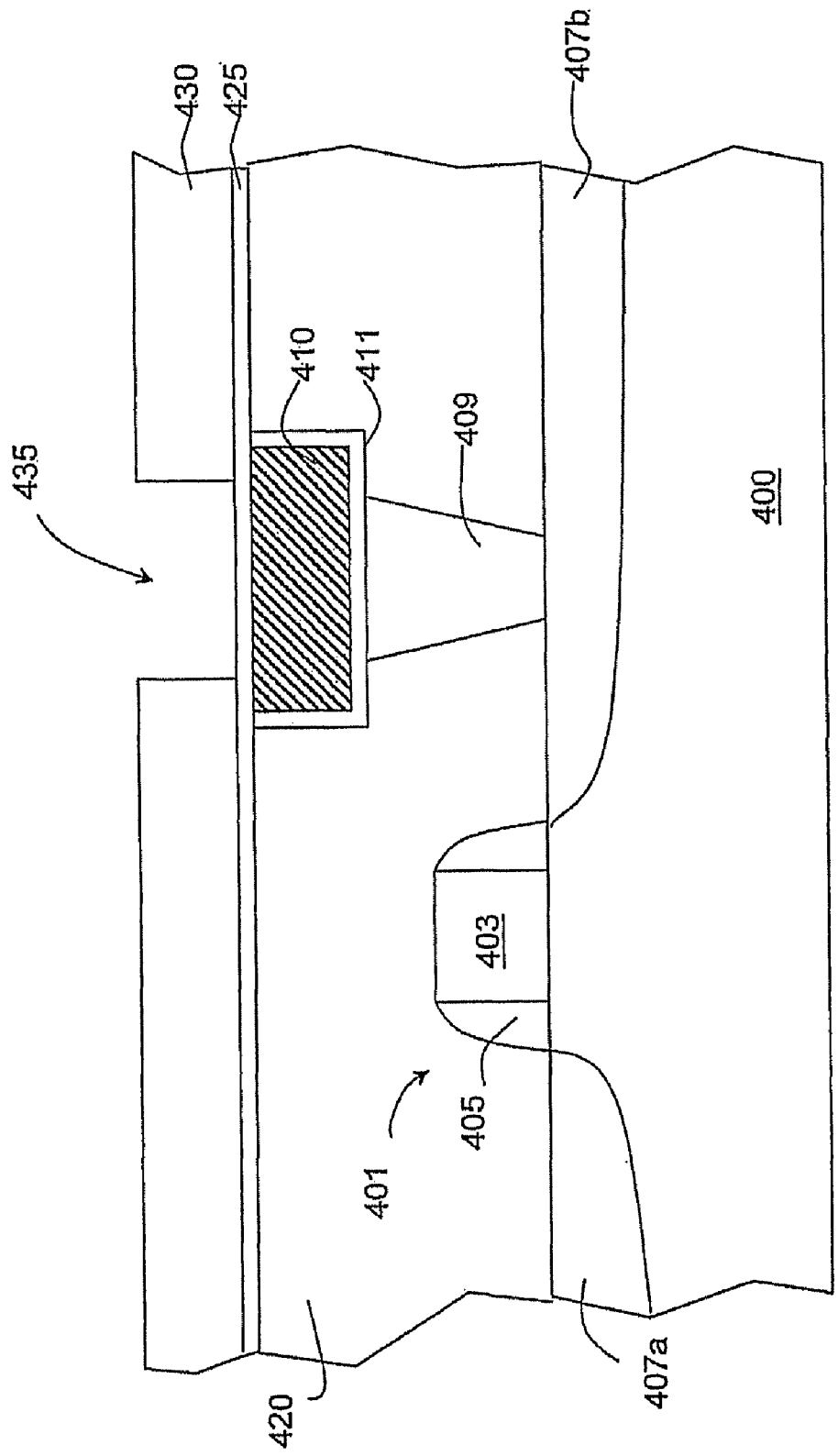

The etch-stop layer 425 may include at least one oxide layer, nitride layer, oxynitride layer or a material layer that has an etch removal rate less than that of a dielectric layer 430 (shown in FIG. 4B). The etch-stop layer 425 may be formed, for example, a CVD process.

Referring to FIG. 4B, a dielectric layer 430 is formed over the etch-stop layer 425. The dielectric layer 430 may include an oxide layer, a nitride layer, an oxynitride layer, a low-k dielectric material layer, an ultra-low-k dielectric material layer, other dielectric material layers or combinations thereof. The dielectric layer 430 may be formed by, for example, a plasma-enchanced CVD (PECVD) process, a spin-on-glass (SOG) process, an undoped silicate glass (USG) process, other suitable processes for forming dielectric layers or combinations thereof.

An opening 435 is formed within the dielectric layer 430. The opening 435 may be formed by a photolithographic process forming a patterned photoresist layer (not shown) having an opening (not shown) corresponding to the opening 435. An etch process uses the patterned photoresist layer (not shown) and removes a portion of a dielectric layer so as to form the opening 435 in the dielectric layer 430. After the etch process, the patterned photoresist layer may be removed by, for example, a photolithographic removal process.

Figure 4C:
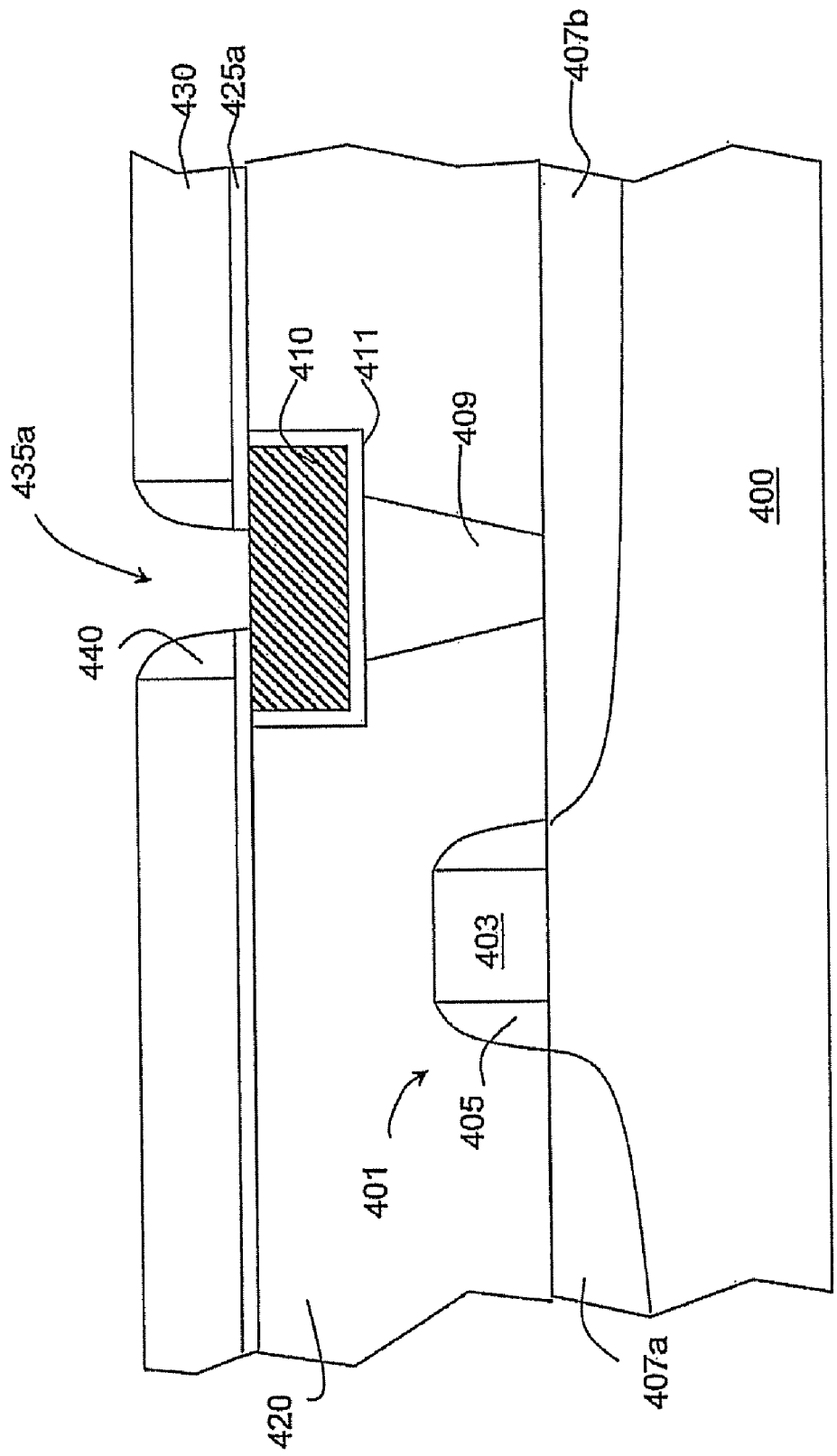

Referring to FIG. 4C, dielectric spacers 440 are formed over the etch-stop layer 425a and on sidewalls of the dielectric layer 430 and the portion of etch stop layer 425 between the dielectric spacers 440 is removed. With the dielectric spacers 440 on the sidewalls of the dielectric layer 430, the opening 435a is smaller than the opening 435 (shown in FIG. 4B). A portion of the top surface (not labeled) of the conductive structure 410 is exposed for electrical connection. In some embodiments, the dielectric spacers 440 may include at least one material of oxide, nitride, oxynitride, carbide, silicon nitride, germanium nitride (GeN), polysilicon, other materials or various combinations thereof.

In some embodiments, the process for forming the dielectric spacers 440 and the etch-stop layer 425a may include forming a dielectric material layer (provided to form the dielectric spacers 440) substantially conformal over the topography of the dielectric layer 430 (shown in FIG. 4B). A removal process (not shown) such as an etch-back process removes a portion of the dielectric material layer and a portion of the etch-stop layer 425 (shown in FIG. 4B) so as to form the dielectric spacers 440 and exposes the top surface of the conductive structure 410.

Figure 4D:
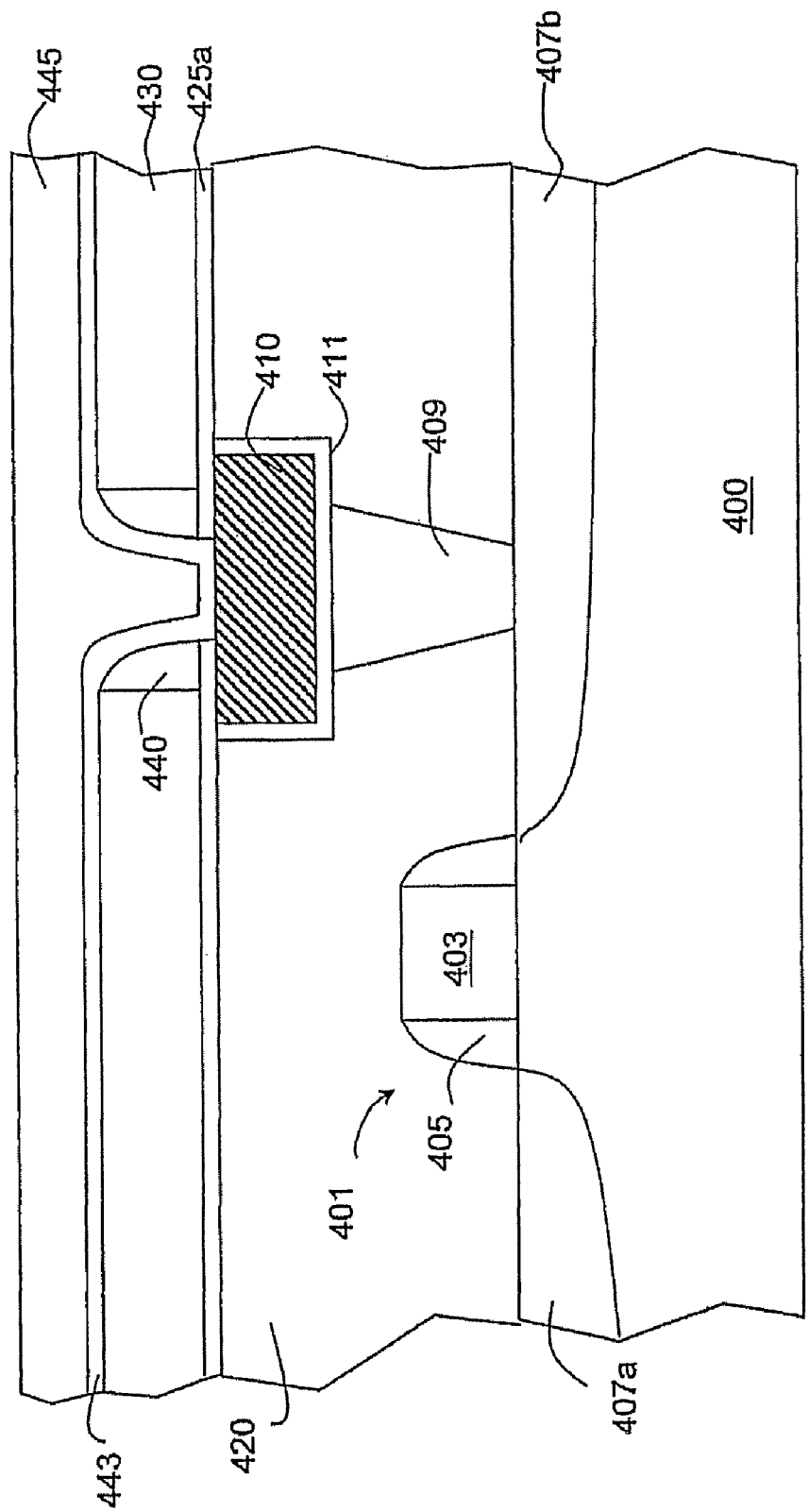

Referring to FIG. 4D, a conductive layer 443 may be formed over the dielectric spacers 440 and a sacrificial layer 445 may be formed over the conductive layer 443. In some embodiments, the conductive layer 443 may be substantially conformal over the topography of the spacers 440 and the dielectric layer 430. In some embodiments, the conductive layer 443 may be a material comprising at least one of a metallic material (e.g., titanium tungsten (TiW), W, platinum (Pt), platinum iridium (PtIr), copper (Cu), aluminum (Al), AlCu, aluminum silicon copper (AlSiCu) or other metallic materials); a metallic nitride (e.g., titanium nitride (TiN), tantalum nitride (TaN), titanium silicon nitride (TiSiN), titanium aluminum nitride (TiAlN), titanium carbon nitride (TiCN), tantalum silicon nitride (TaSiN), tantalum aluminum nitride (TaAlN), tungsten nitride (WN) or other metallic nitrides); a metallic silicide (e.g., titanium silicide (TiSi$_x$), nickel silicide (NSi$_x$), cobalt silicide (CoSi$_x$) or other metallic silicides); a conductive oxide (e.g., iridium oxide (IrO$_2$), ruthenium oxide (RuO$_2$), iridium ruthenium oxide (IrRuO$_3$), lithium niobate (LiNbO$_3$) or other conductive oxides) or it may include composite material layers (e.g., Ti/TiN, Ta/TaN, TiN/W, TaN/Ta/Cu or other composite material layer). In other embodiments, the conductive layer 443 may include at least one of a TaN layer, a Ta layer, a TiN layer, a Ti layer, other metallic layers or various combinations thereof. The conductive layer 443 may be formed by, for example, a CVD process, a PVD process or an ALD process. In some embodiments, the conductive layer 443 may have a thermal conductivity less than that of the conductive structure 410.

The sacrificial layer 445 may include a silicon oxide layer, a silicon nitride layer, an oxynitride layer, a low-k dielectric material layer, an ultra-low-k dielectric material layer, another suitable dielectric material layer or combinations thereof. The sacrificial layer 445 may be formed, for example, by a plasma-enhanced CVD (PECVD) process, a spin-on-glass (SOG) process, an undoped silicate glass (USG) process or another process that is adequate to form a dielectric layer or combinations thereof.

Figure 4E:
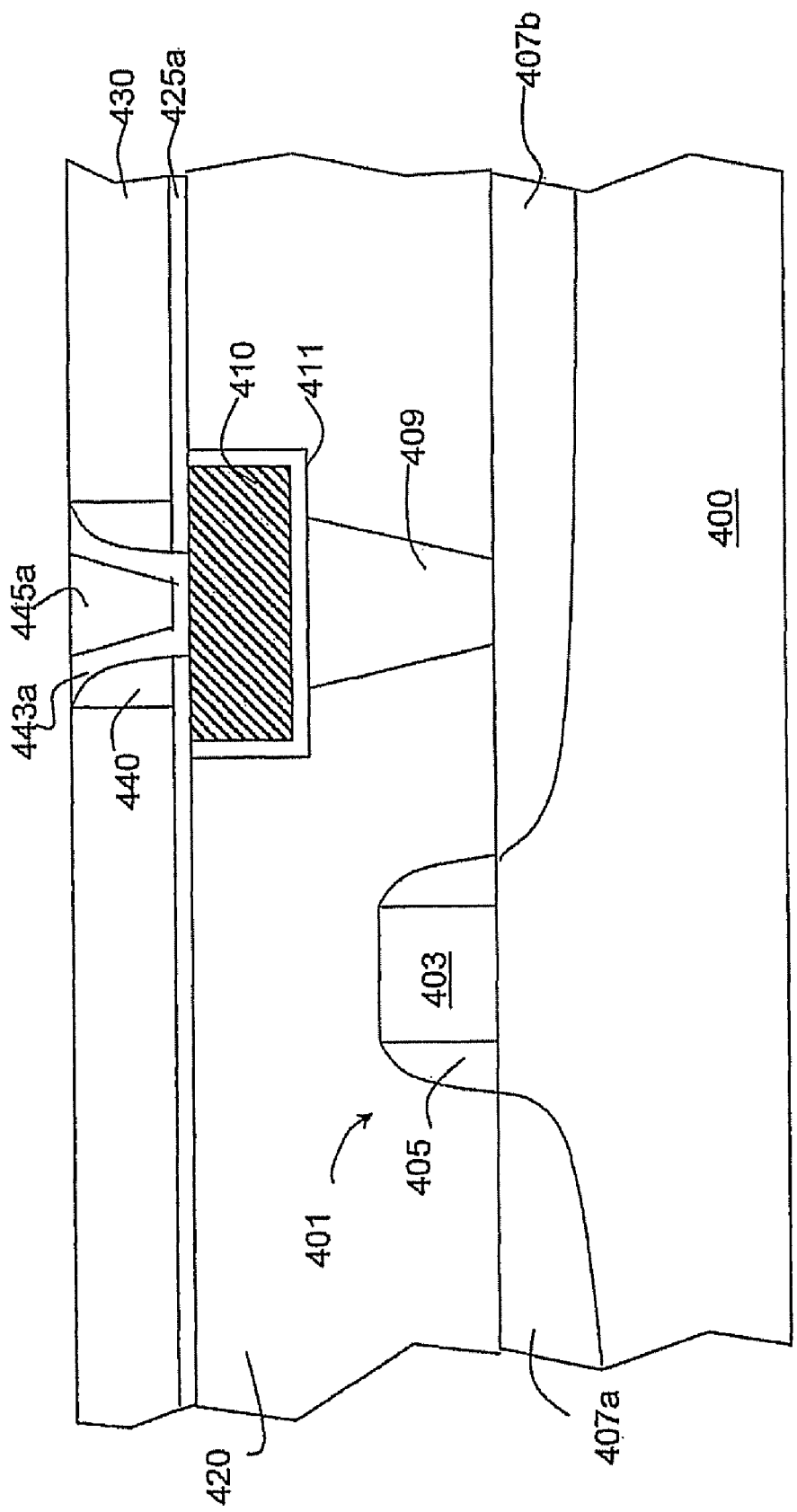

Referring to FIG. 4E, a removal process 447 such as an etch-back process or CMP process may remove a portion of the sacrificial layer 445 and a portion of the conductive layer 443 over the top surface of the dielectric layer 430 so as to form the sacrificial layer 445a and the conductive layer 443a.

Figure 4F:
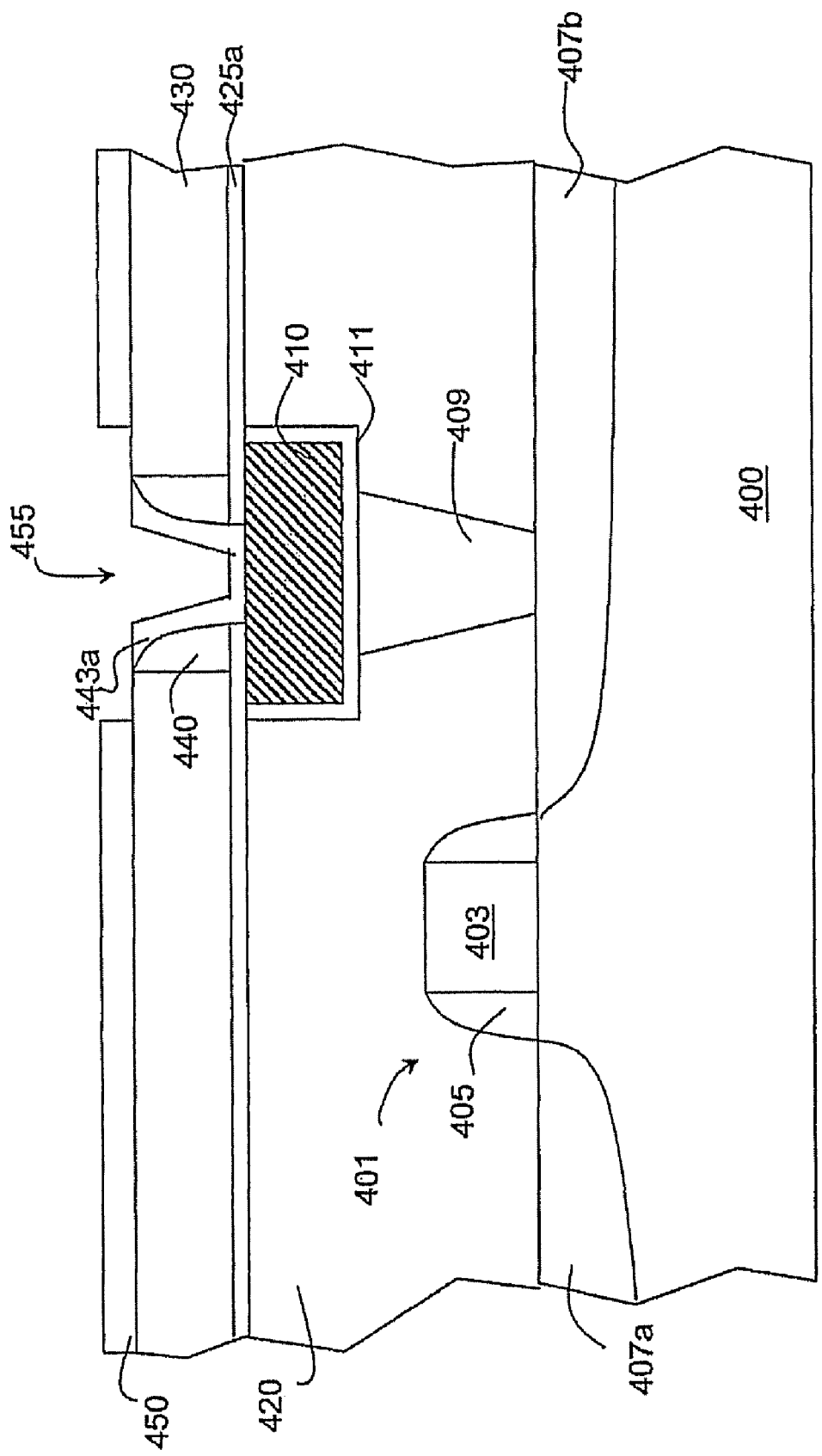

Referring to FIG. 4F, a dielectric layer 450 having an opening 455 therein is formed over the dielectric layer 430. The sacrificial layer 445a is removed. The dielectric layer 450 may include at least one of a silicon nitride layer, an oxynitride layer, a silicon oxide layer, a carbide layer, another dielectric material layer or various combinations thereof. The dielectric layer 450 may be formed by, for example, a CVD process. In some embodiment using 90-nm technology, the dielectric layer 450 may have a thickness between about 10 nm and about 100 nm.

In some embodiments, the process for forming the dielectric layer 450 and the opening 455 may include forming a dielectric material layer (provided to form the dielectric layer 450) overlying the structure shown in FIG. 4E. A patterned photoresist layer (not shown) with an opening corresponding the opening 455 is formed over the dielectric layer 450. An etch process using the patterned photoresist layer as a mask removes a portion of the dielectric material layer and the sacrificial layer 445a so as to form the dielectric layer 450 with the opening 455. After the etch process, a photoresist removal process may remove the patterned photoresist layer.

Figure 4G:
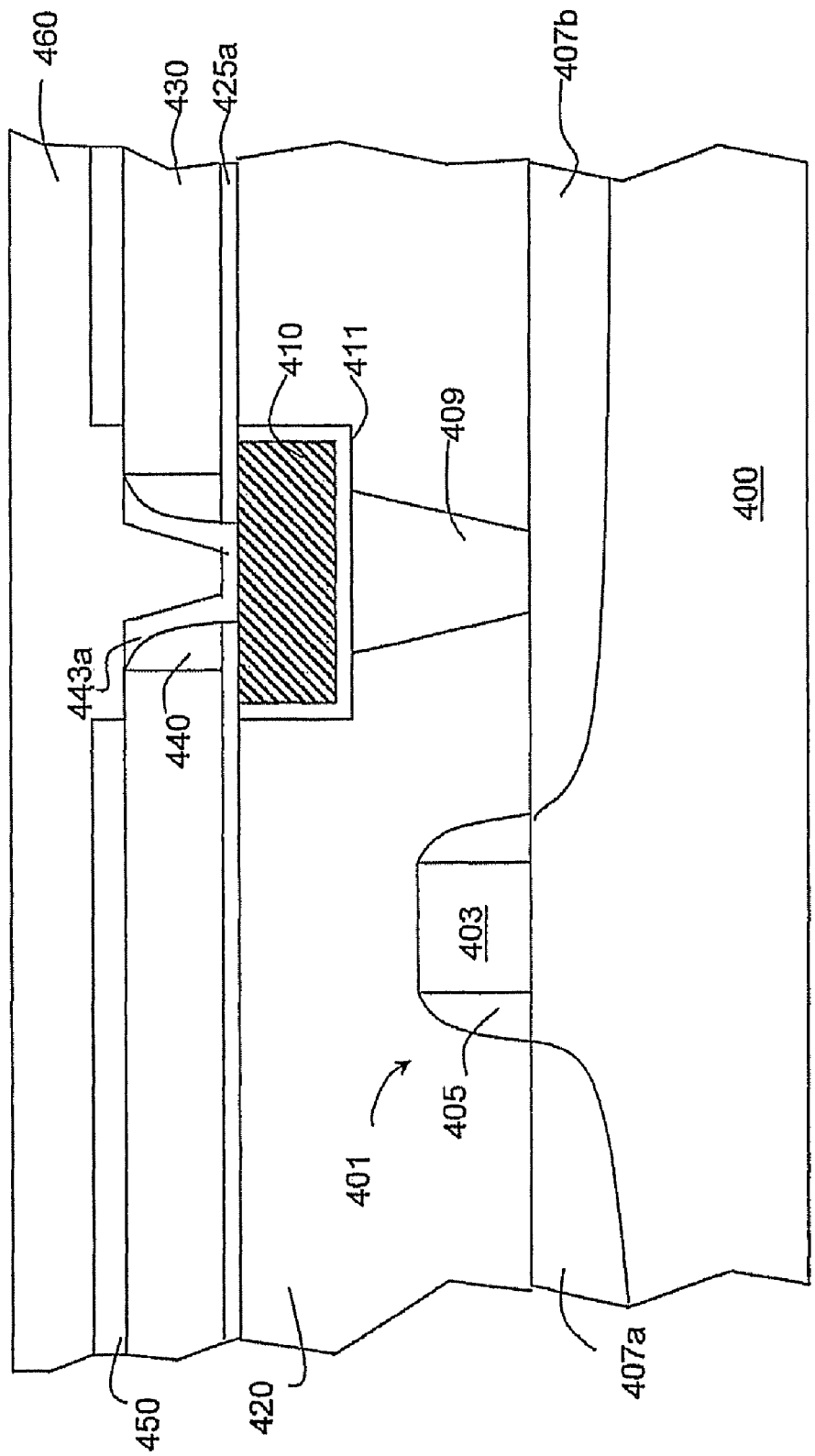

Referring to FIG. 4G, a PCM layer 460 is formed over the structure shown in FIG. 4F including over dielectric layer 450. In some embodiments, the PCM layer 460 may substantially fill the opening 455 (shown in FIG. 4F). The material of and methods for forming the PCM layer 460 may be similar to those for forming a PCM layer described above in conjunction with FIGS. 2G and 2H.

Figure 4H:
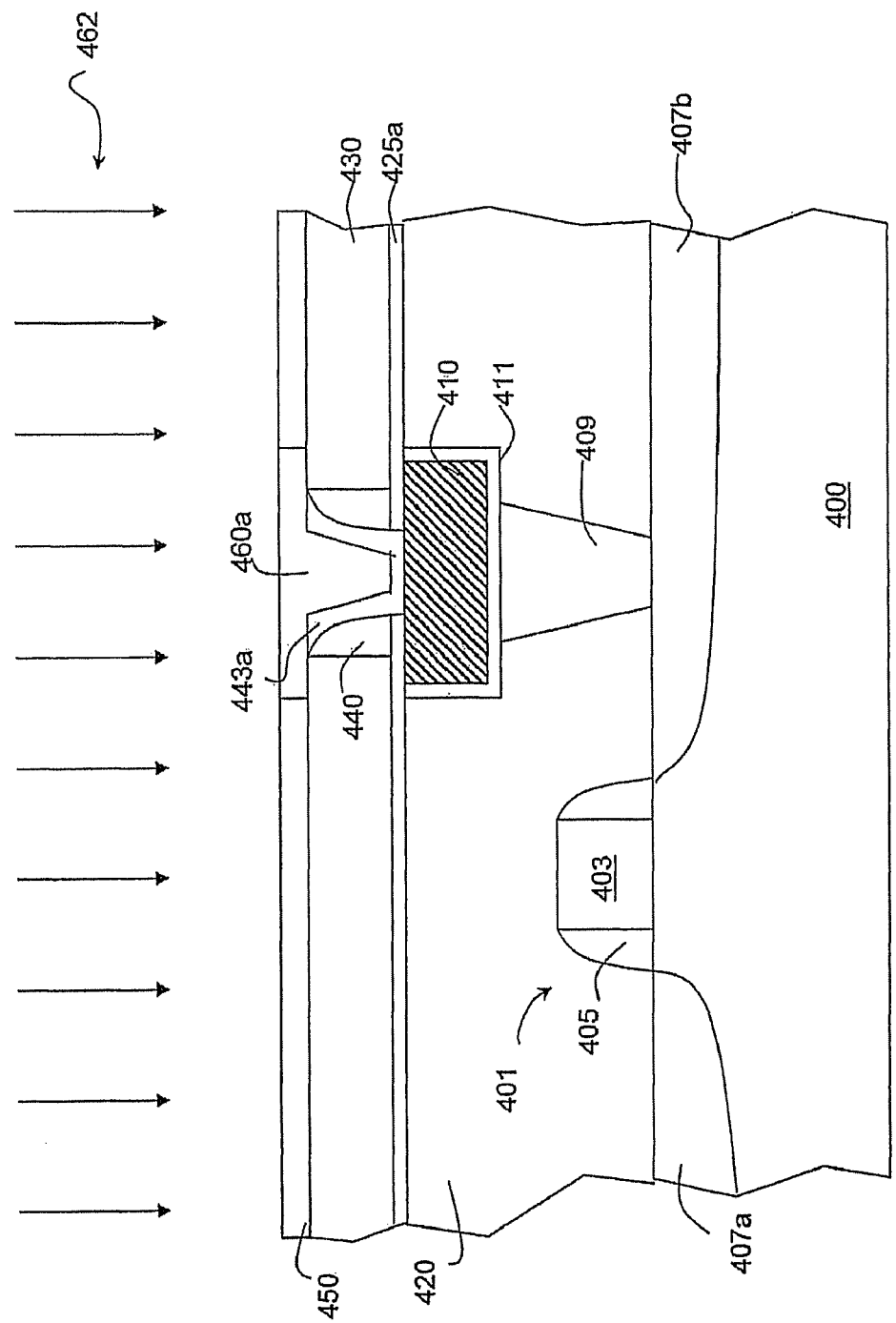

Referring to FIG. 4H, a removal process 462 such as an etch-back process or a CMP process may remove a portion of the PCM layer 460 from over the top surface of the dielectric layer 450 so as to form the PCM layer 460a. In some embodiments, the top surface (not labeled) of the PCM layer 460 may be substantially level with the top surface (not labeled) of the dielectric layer 450.

Figure 4I:
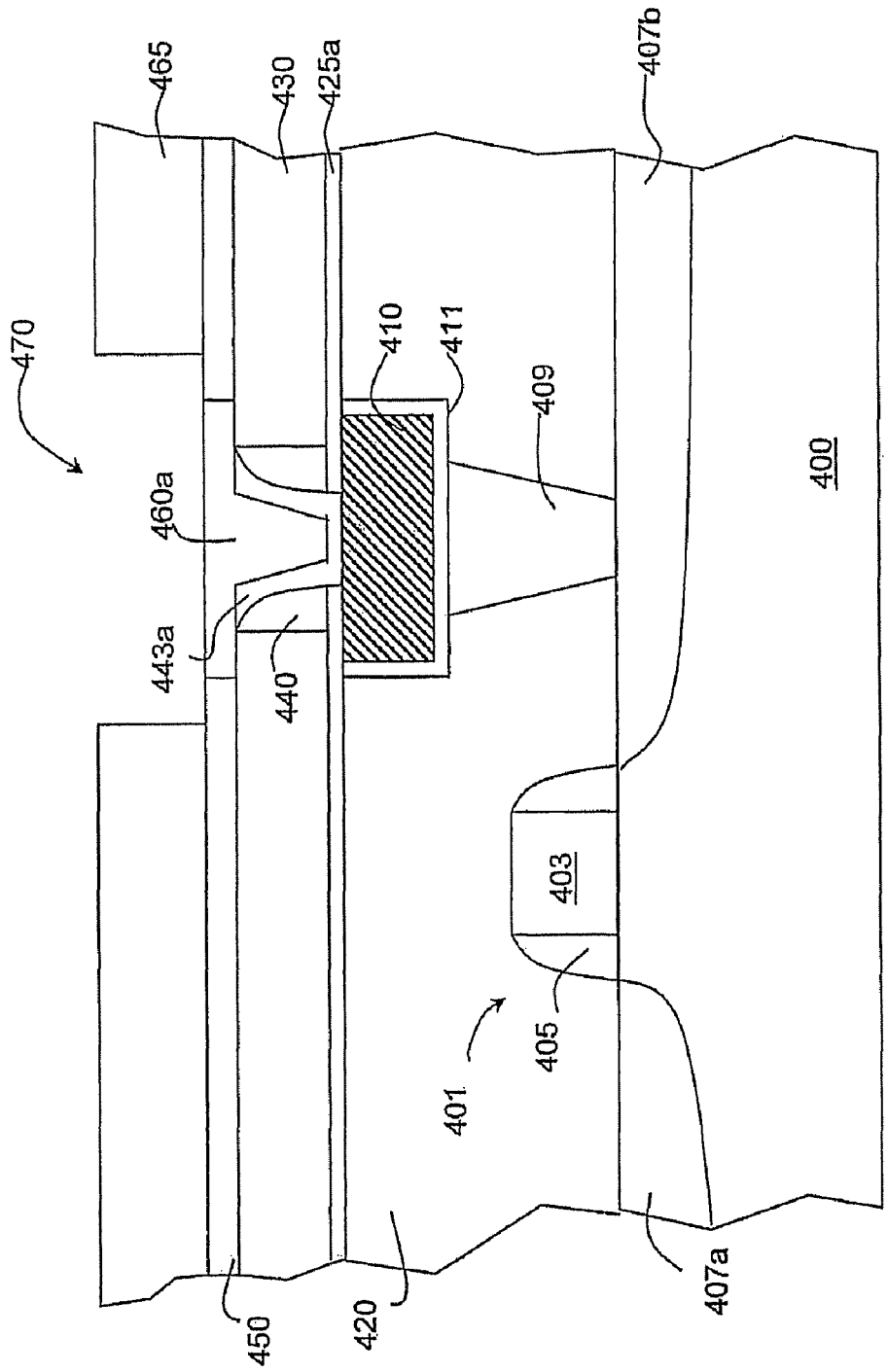

Referring to FIG. 4I, a dielectric layer 465 having an opening 470 therein is formed over the dielectric layer 450, exposing at least a portion of the top surface of the PCM layer 460a. The dielectric layer 465 may include at least one of a silicon oxide layer, a silicon nitride layer, an oxynitride layer, a low-k dielectric material layer, an ultra-low-k dielectric material layer or other dielectric material layers or combinations thereof. The dielectric layer 465 may be formed, for example, a plasma-enchanced CVD (PECVD) process, a spin-on-glass (SOG) process, an undoped silicate glass (USG) process or another process that is adequate to form a dielectric layer or combinations thereof,.

Figure 4J:
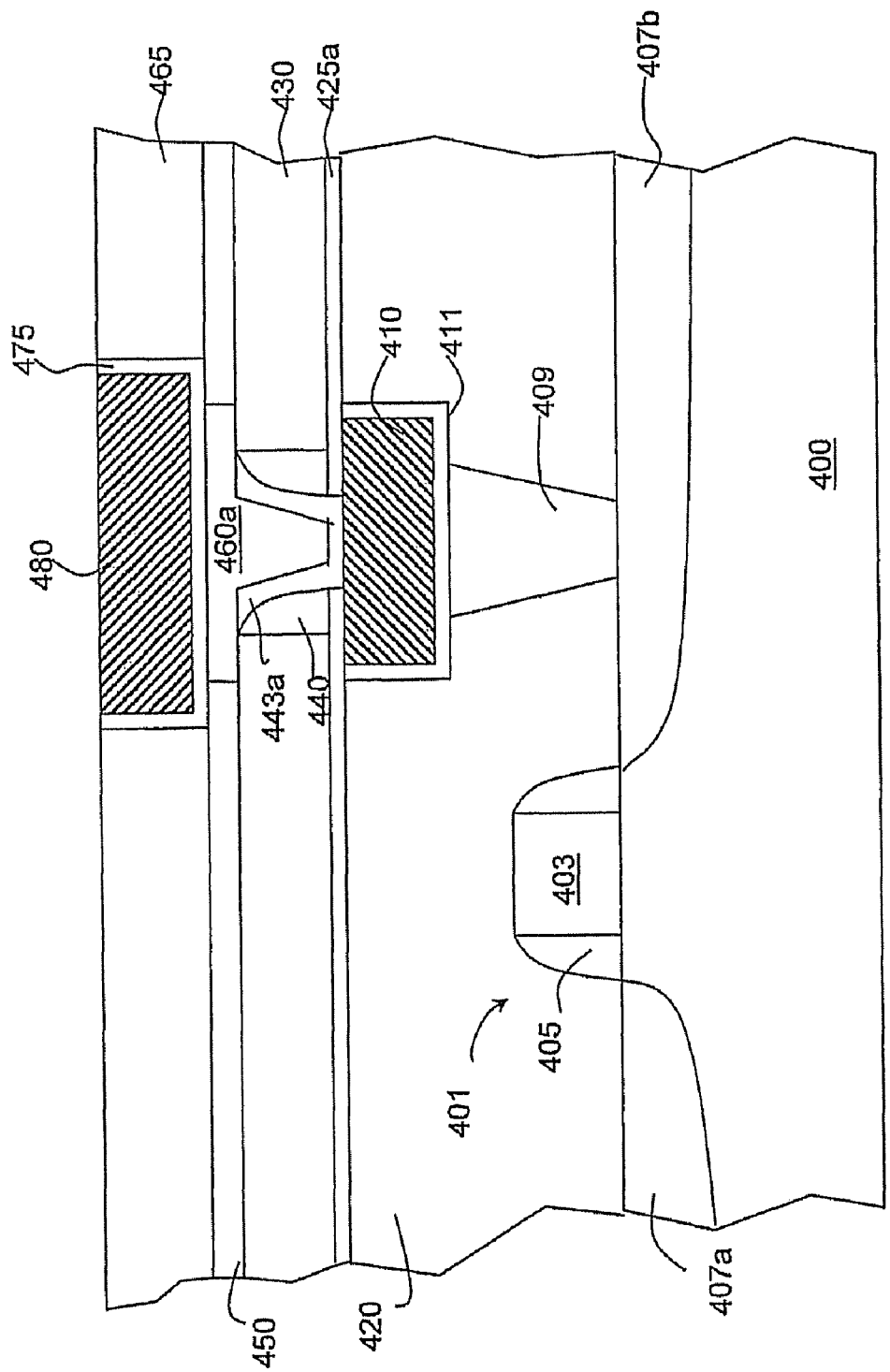

Referring to FIG. 4J, a barrier layer 475 and a conductive layer 480 are formed within the opening 470 that was shown in FIG. 4I. The barrier layer 475 may be substantially conformal within the opening 470. The barrier layer 475 may include at least one of a TaN layer, a Ta layer, a TiN layer, a Ti layer, other metallic layer or various combinations thereof. The barrier layer 475 may be formed by, for example, a CVD process, a PVD process or an ALD process.

The conductive layer 480 may include, for example, a material comprising at least one of a metallic material (e.g., titanium tungsten (TiW), W, platinum (Pt), platinum iridium (PtIr), copper (Cu), aluminum (Al), AlCu, aluminum silicon copper (AlSiCu) or other metallic materials); a metallic nitride (e.g., titanium nitride (TiN), tantalum nitride (TaN), titanium silicon nitride (TiSiN), titanium aluminum nitride (TiAlN), titanium carbon nitride (TiCN), tantalum silicon nitride (TaSiN), tantalum aluminum nitride (TaAlN), tungsten nitride (WN) or other metallic nitrides); a metallic silicide (e.g., titanium silicide (TiSi$_x$), nickel silicide (NSi$_x$), cobalt silicide (CoSi$_x$) or other metallic silicides); a conductive oxide (e.g., iridium oxide (IrO$_2$), ruthenium oxide (RuO$_2$), iridium ruthenium oxide (IrRuO$_3$), lithium niobate (LiNbO$_3$) or other conductive oxides) or a composite material layers (e.g., Ti/TiN, Ta/TaN, TiN/W, TaN/Ta/Cu or other composite material layers). In some embodiments, the conductive layer 480 may be formed by, for example, a CVD process, a PVD process, an ALD process, an electrochemical plating process, an electroless plating process, other thin film deposition process or various combinations thereof.

By forming the spacers 440, the cross-sectional area of the PCM layer 460a shown in FIG. 4J may be desirably reduced compared to that of a PCM layer of the same thickness formed in the original opening 435 shown in FIG. 4B. As such, the voltage or power required to be applied to the conductive structure 410 to transform the PCM layer 460A, is reduced in comparison to the voltage/power that would be required to transform the bulk PCM layer formed within the opening 435 (shown in FIG. 4B) without the spacers 440. Due to the low-power operation, the programming speed of the PCM cell may be desirably enhanced.

Figure 4K:
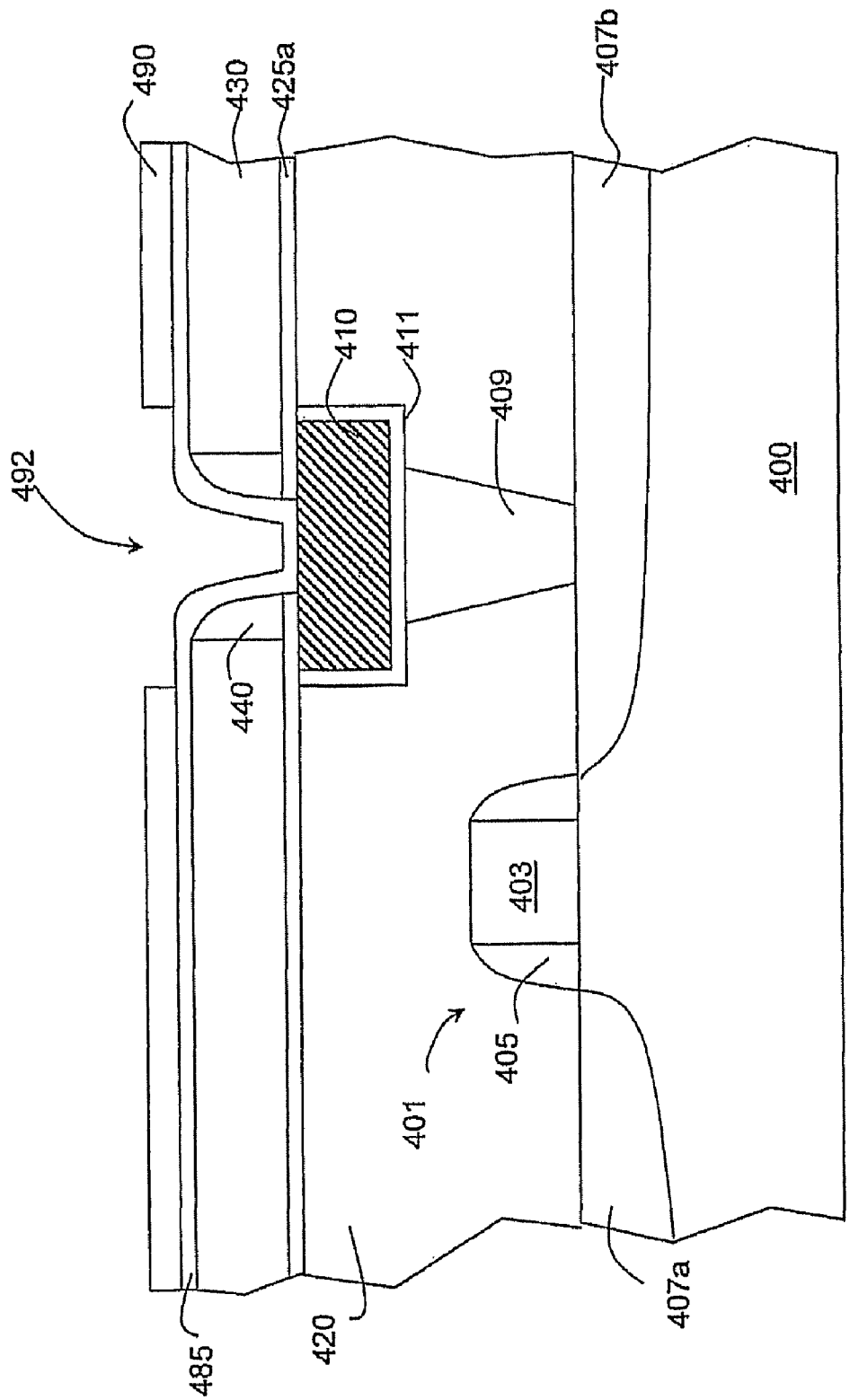
FIGS. 4K-4M are cross-sectional views showing a sequence of steps in an exemplary method for forming a PCM layer.
Figure 4L:
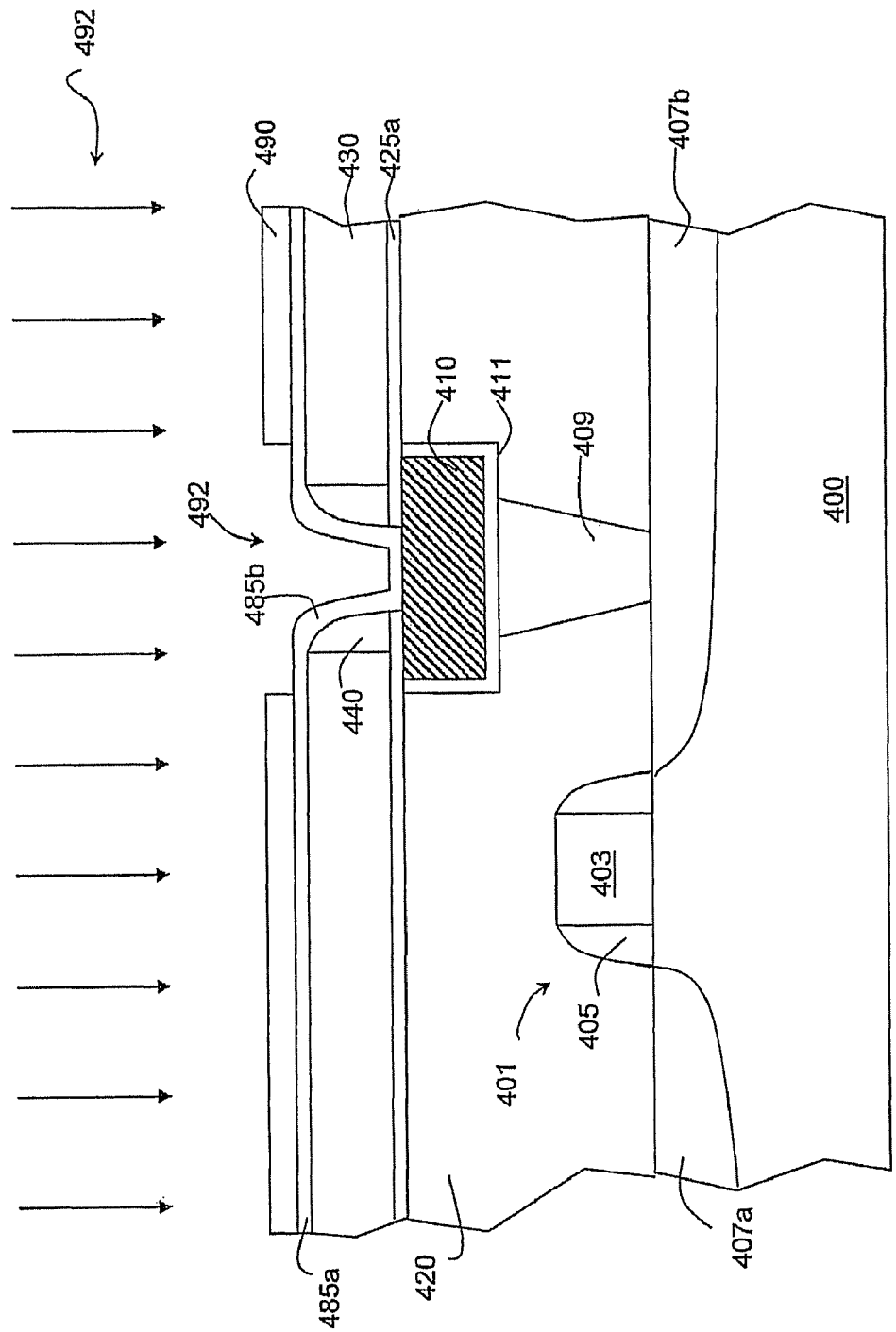
Figure 4M:
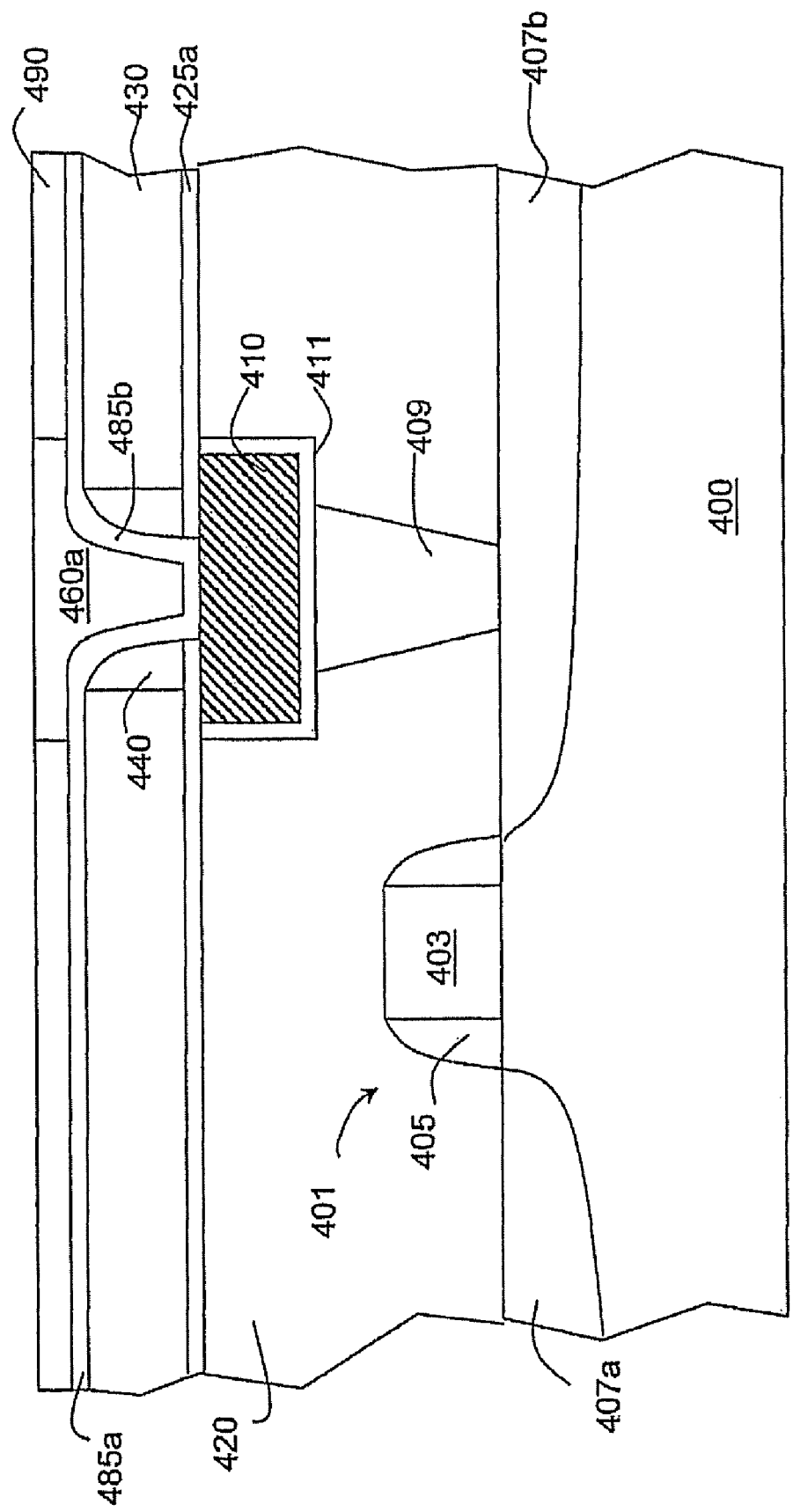

FIGS. 4K-4M are cross-sectional views showing an exemplary method for forming a PCM layer.

Referring to FIG. 4K, after the formation of the structure shown in FIG. 4C, a silicon layer 485 such as a crystalline silicon layer, a polysilicon layer or an amorphous silicon layer may be formed. In some embodiments, the silicon layer 485 may be substantially conformal over the topography of the spacers 440 and the dielectric layer 430.

After the formation of the silicon layer 485, a dielectric layer 490 having an opening 492 therein is formed over the silicon layer 485. The opening 490 exposes a portion of the silicon layer 485. The dielectric layer 490 may include at least one of a nitride layer, an oxynitride layer, an oxide layer, a carbide layer, other dielectric material layers or various combinations thereof. The dielectric layer 490 may be formed by, for example, a CVD process. In some embodiments using 90-nm technology, the dielectric layer 490 may have a thickness between about 10 nm and about 100 nm. In some embodiments, the methods for forming the dielectric layer 490 and the opening 492 may be similar to those of the dielectric layer 450 and the opening 455 described above in connection with FIG. 4F.

Referring to FIG. 4L, a silicon-germanium (SiGe) formation process 494 is applied to the exposed portion of the silicon layer 485 so as to form SiGe portion 485b. The silicon layer 485 covered by the dielectric layer 490 remains as silicon portion 485a. The SiGe portion 485b may provide a desired low thermal conductivity such that heat generated in the PCM layer 460a (shown in FIG. 4M) would be prevented from transmitting to the conductive structure 410 and may desirably remain in the PCM layer 460a (shown in FIG. 4M), such that the PCM layer 460a (shown in FIG. 4M) may be desirably transformed.

After the formation of the SiGe portion 485b, the PCM layer 460a may be formed within the opening 492. The process for forming the PCM layer 460a may be similar to that described above in connection with FIGS. 4G and 4H. After the formation of the PCM layer 460a, the subsequent processes provided for forming the barrier layer 475 and the conductive layer 480 described in conjunction with FIGS. 4I and 4J may be used so as to form a desired phase change element.

In some embodiments, the programming and/or erasing of the PCM cell may be as described in commonly assigned and copending U.S. patent application Ser. No. 11/752,736, filed on May 23, 2007, the entire contents of which are hereby incorporated by reference herein.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A semiconductor structure, comprising:
   a transistor over a substrate, the transistor comprising a gate and a contact region, which is adjacent to the gate and within the substrate, and a channel extending in a channel direction;
   a first dielectric layer over the contact region;
   a conductive contact structure within the first dielectric layer and over the contact region;
   a first electrode and a second electrode within the first dielectric layer, wherein at least one of the first electrode and the second electrode overlies the conductive contact structure and the first electrode is laterally separated from the second electrode along a direction orthogonal to the channel direction; and
   a phase change structure between the first electrode and the second electrode, wherein the phase change structure comprises:
   at least one spacer within the first dielectric layer; and
   a phase change material (PCM) layer overlying the spacer.

2. The semiconductor structure of claim 1, wherein the PCM layer is substantially conformal over the spacer.

3. The semiconductor structure of claim 2 further comprising a second dielectric layer over the PCM layer, wherein a top surface of the second dielectric layer is substantially level with a top surface of the first dielectric layer.

4. The semiconductor structure of claim 1, wherein the PCM layer contacts the first dielectric layer.

5. The semiconductor structure of claim 1, wherein the PCM layer laterally extends from the first electrode to the second electrode.

6. The semiconductor structure of claim 1, wherein a top surface of the PCM layer is substantially level with a top surface of the first dielectric layer.

7. The semiconductor structure of claim 1, wherein the at least one of the first electrode and the second electrode contacts the conductive contact structure.

8. A semiconductor structure, comprising:
a transistor over a. substrate, the transistor comprising a gate and a contact region adjacent to the gate and within the substrate;
a first dielectric layer over the contact region;
a conductive contact structure within the first dielectric layer and over the contact region;
a first electrode within the first dielectric layer;
a second dielectric layer over the first electrode;
a phase change structure within the second dielectric layer, the phase change structure comprising:
at least one conductive sidewall spacer within the second dielectric layer and having a bottom portion with a greater thickness than a top portion thereof; and
a phase change material (PCM) layer on top of an upper surface of the conductive spacer;
a second electrode over the phase change structure; and
a third dielectric layer over the PCM layer, wherein a top surface of the third dielectric layer is substantially coplanar with a top surface of the second dielectric layer.

9. The semiconductor structure of claim 8, wherein the first electrode contacts the contact structure.

10. The semiconductor structure of claim 8, wherein the conductive spacer is disposed completely within and completely laterally bounded by an opening in the second dielectric layer and the PCM layer is substantially conformal over the conductive spacer.

11. The semiconductor structure of claim 8, wherein the conductive spacer is disposed completely within and completely laterally bounded by an opening in the second dielectric layer and the PCM layer is separated from the first electrode by the conductive spacer.

12. The semiconductor structure of claim 8, wherein the conductive spacer is disposed completely within and completely laterally bounded by an opening in the second dielectric layer and laterally surrounds the PCM layer.

13. The semiconductor structure of claim 8, wherein a top surface of the PCM layer is substantially level with a top surface of the second dielectric layer.

14. A semiconductor structure, comprising:
a transistor over a substrate, the transistor comprising a gate and a contact region adjacent to the gate and within the substrate;
a first dielectric layer over the contact region;
a contact structure within the first dielectric layer and over the contact region;
a first electrode within the first dielectric layer;
a second dielectric layer over the first electrode;
a phase change structure within the second dielectric layer, the phase change structure comprising:
spacers within the second dielectric layer;
a conductive layer extending from a first one of the spacers to a second one of the spacers and extending vertically along and directly contacting sidewalls of said spacers; and
a phase change material (PCM) layer over the conductive layer and laterally spaced from the spacers by the conductive layer; and
a second electrode over the phase change structure, wherein said conductive layer comprises one of titanium tungsten (TiW), tungsten (W), platinum (Pt), platinum iridium (PtIr), copper (Cu), aluminum (Al), aluminum copper (AICu), and aluminum silicon copper (AlSiCu).

15. The semiconductor structure of claim 14, wherein the PCM layer has a top portion wider than a bottom portion thereof.

16. The semiconductor structure of claim 15, wherein the top portion of the PCM layer has a thickness between about 10 nanometers (nm) and about 100 nm.

* * * * *